US012463127B2

(12) United States Patent
Sun et al.

(10) Patent No.: US 12,463,127 B2
(45) Date of Patent: Nov. 4, 2025

(54) INTEGRATED CIRCUIT (IC) PACKAGE EMPLOYING A RE-DISTRIBUTION LAYER (RDL) SUBSTRATE(S) WITH PHOTOSENSITIVE DIELECTRIC LAYER(S) FOR INCREASED PACKAGE RIGIDITY, AND RELATED FABRICATION METHODS

(71) Applicant: QUALCOMM Incorporated, San Diego, CA (US)

(72) Inventors: Yangyang Sun, San Diego, CA (US); Manuel Aldrete, Encinitas, CA (US); Wei Wang, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 388 days.

(21) Appl. No.: 18/155,398

(22) Filed: Jan. 17, 2023

(65) Prior Publication Data
US 2024/0243056 A1 Jul. 18, 2024

(51) Int. Cl.
*H01L 23/498* (2006.01)
*H01L 21/48* (2006.01)
(Continued)

(52) U.S. Cl.
CPC .... *H01L 23/49894* (2013.01); *H01L 21/4853* (2013.01); *H01L 21/4857* (2013.01);
(Continued)

(58) Field of Classification Search
CPC ........... H01L 23/49894; H01L 21/4853; H01L 21/4857; H01L 21/486; H01L 23/49816;
(Continued)

(56) References Cited

U.S. PATENT DOCUMENTS

2016/0014878 A1* 1/2016 Kilhenny ........... H10H 20/8585
438/26
2017/0338204 A1* 11/2017 Lee ......................... H01L 24/20
(Continued)

OTHER PUBLICATIONS

International Search Report and Written Opinion for International Patent Application No. PCT/US2024/010401, mailed Jun. 5, 2024, 15 pages.

*Primary Examiner* — Tong-Ho Kim
(74) *Attorney, Agent, or Firm* — Withrow & Terranova, PLLC

(57) ABSTRACT

Integrated circuit (IC) packages employing a re-distribution layer (RDL) substrate(s) with photosensitive non-polymer dielectric material layers for increased package rigidity, and related fabrication methods. To reduce or minimize warpage of an IC package employing a RDL substrate, the RDLs of the RDL substrate are photosensitive non-polymer dielectric material layers. The photosensitive non-polymer dielectric material layers can exhibit increased rigidity as a result of being hardened when exposed to light and cured during fabrication of the RDL substrate. The photosensitive non-polymer dielectric material layers can also exhibit increased rigidity as a result of being an inorganic polymer (e.g., SiOx, SiN material) that has a higher material modulus for increased stiffness and/or a lower coefficient of thermal expansion (CTE) for reduced thermal contraction and expansion, as opposed to for example, an organic polymer material (e.g., Polyimide) which has less stiffness and a higher CTE.

21 Claims, 18 Drawing Sheets

(51) Int. Cl.
  *H01L 23/538* (2006.01)
  *H01L 25/10* (2006.01)
  *H01L 23/00* (2006.01)

(52) U.S. Cl.
  CPC ...... *H01L 21/486* (2013.01); *H01L 23/49816* (2013.01); *H01L 23/49822* (2013.01); *H01L 23/49833* (2013.01); *H01L 23/49838* (2013.01); *H01L 23/5385* (2013.01); *H01L 23/5386* (2013.01); *H01L 25/105* (2013.01); *H01L 24/16* (2013.01); *H01L 24/32* (2013.01); *H01L 24/73* (2013.01); *H01L 2224/16225* (2013.01); *H01L 2224/32225* (2013.01); *H01L 2224/73204* (2013.01); *H01L 2225/1023* (2013.01); *H01L 2225/1041* (2013.01); *H01L 2225/1058* (2013.01); *H01L 2225/107* (2013.01); *H01L 2225/1088* (2013.01); *H01L 2225/1094* (2013.01); *H01L 2924/1511* (2013.01); *H01L 2924/15174* (2013.01); *H01L 2924/152* (2013.01)

(58) Field of Classification Search
  CPC ......... H01L 23/49822; H01L 23/49833; H01L 23/49838; H01L 23/5385; H01L 23/5386; H01L 25/105; H01L 24/16; H01L 24/32; H01L 24/73; H01L 2224/16225; H01L 2224/32225; H01L 2224/73204; H01L 2225/1023; H01L 2225/1041; H01L 2225/1058; H01L 2225/107; H01L 2225/1088; H01L 2225/1094; H01L 2924/1511; H01L 2924/15174; H01L 2924/152; H01L 25/50; H01L 2221/68327; H01L 2221/68345; H01L 21/568; H01L 21/6835; H01L 23/3128; H01L 23/5389; H01L 2221/68359; H01L 23/291
  USPC ....................................................... 257/690
  See application file for complete search history.

(56) References Cited

U.S. PATENT DOCUMENTS

| | | |
|---|---|---|
| 2018/0141801 A1* | 5/2018 | Fantner .................. G01Q 60/38 |
| 2020/0035606 A1 | 1/2020 | Bhagavat et al. |
| 2020/0043893 A1* | 2/2020 | Chen .................. H01L 23/3128 |
| 2021/0082857 A1* | 3/2021 | Chen .................. H01L 23/5386 |
| 2021/0098408 A1 | 4/2021 | Ting et al. |

* cited by examiner

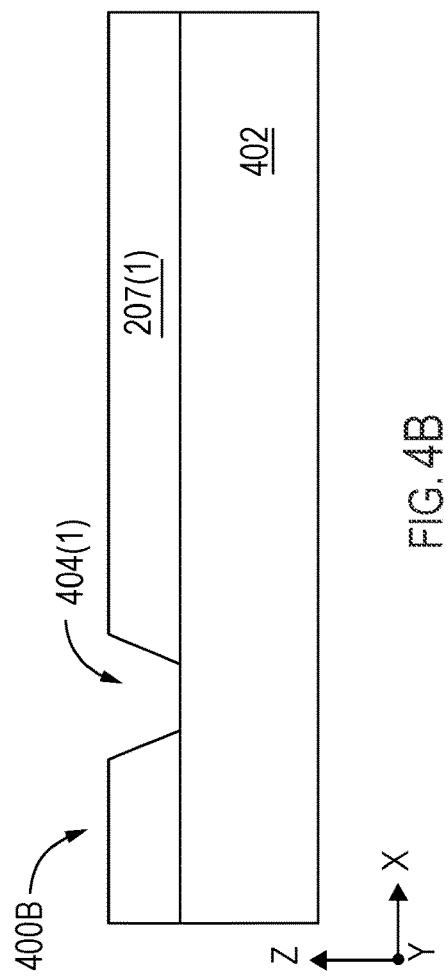
FIG. 4A
FIG. 4B
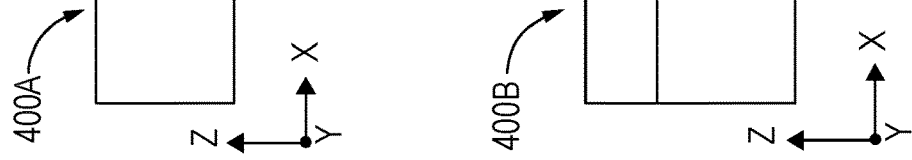
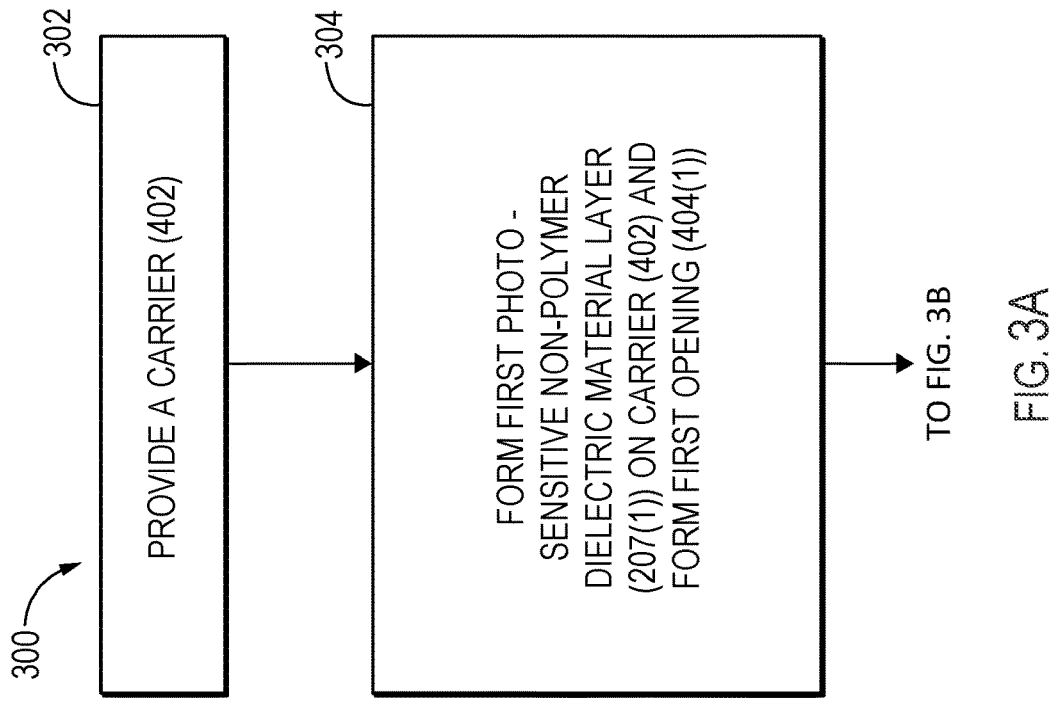
FIG. 3A

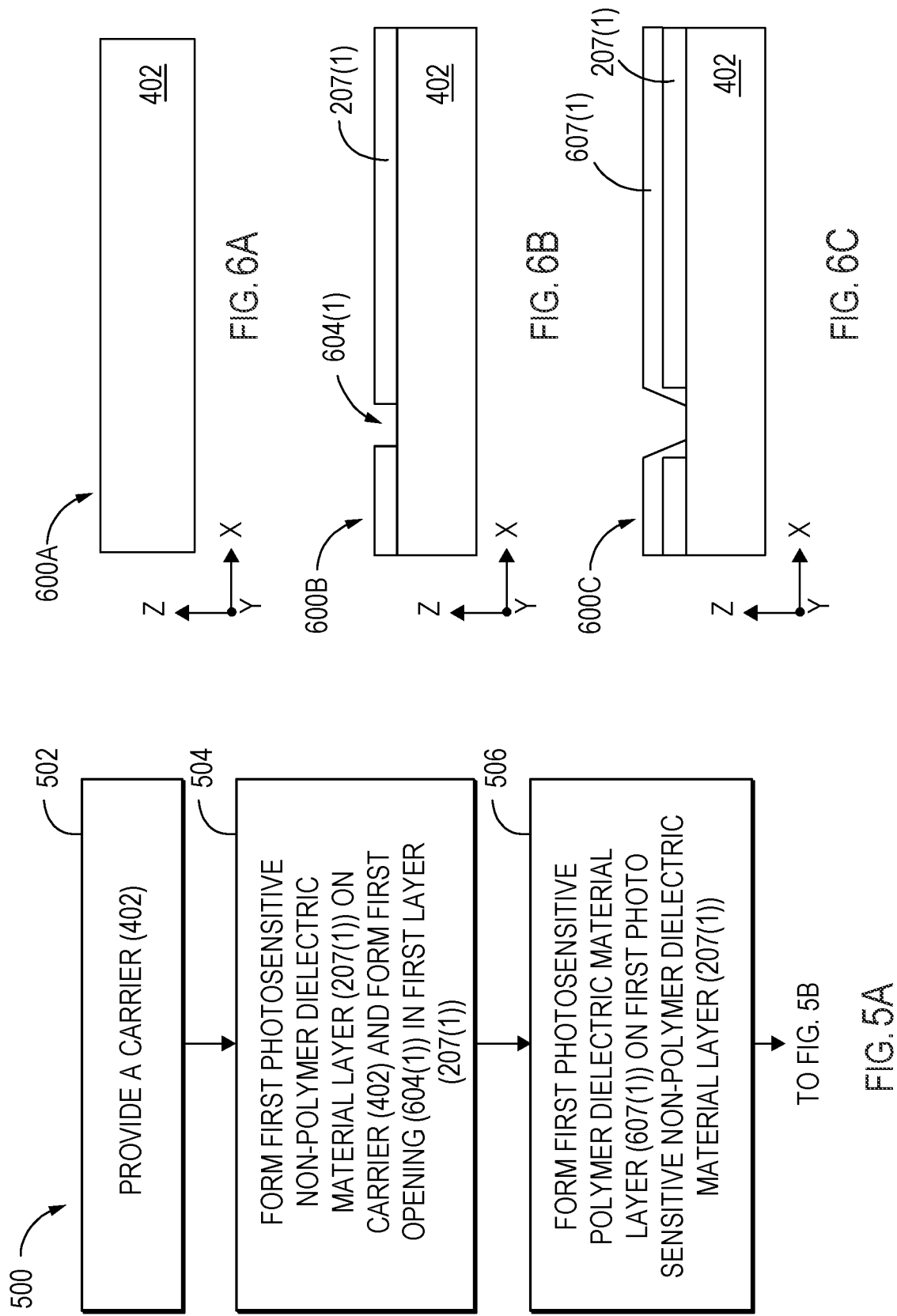

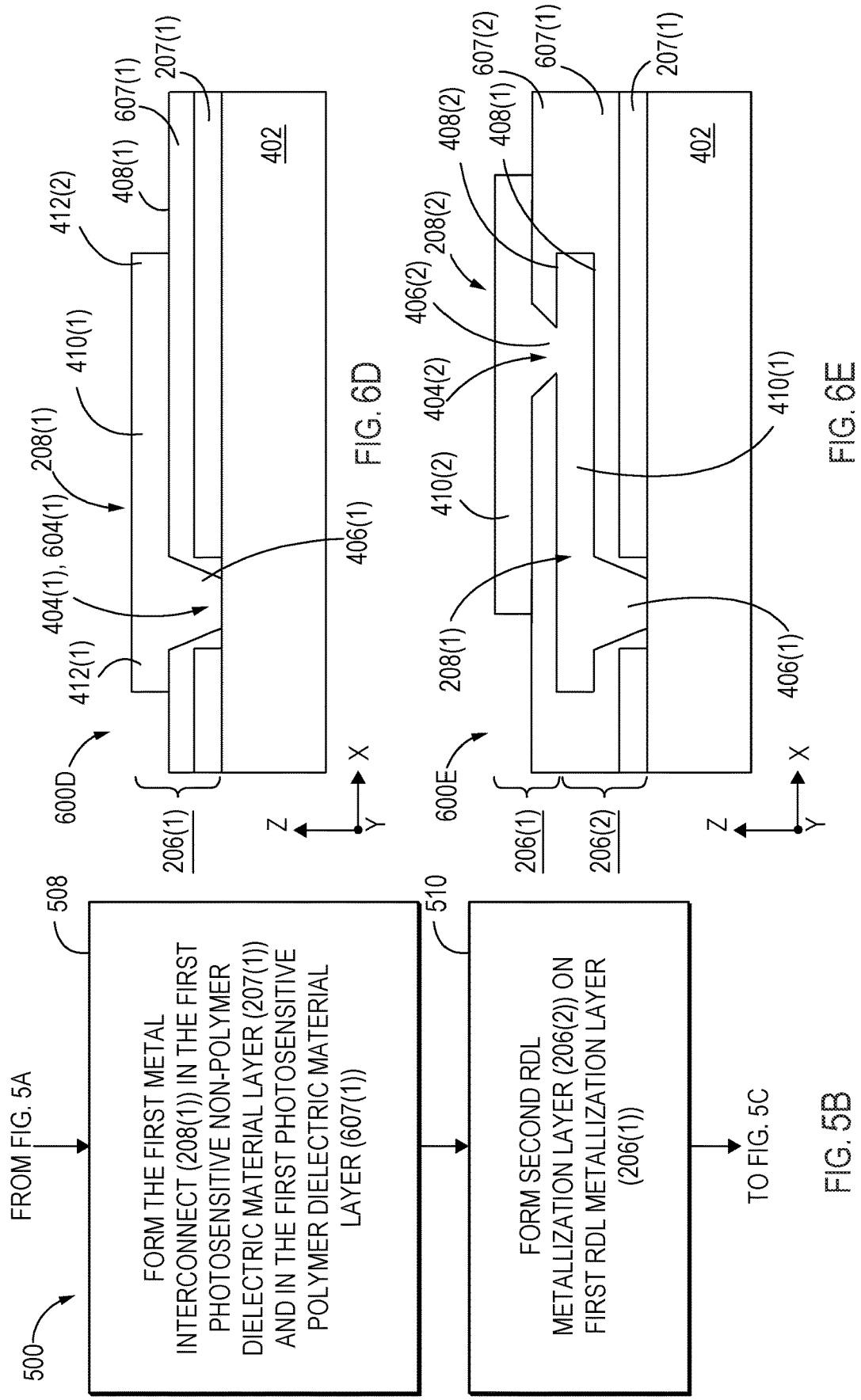

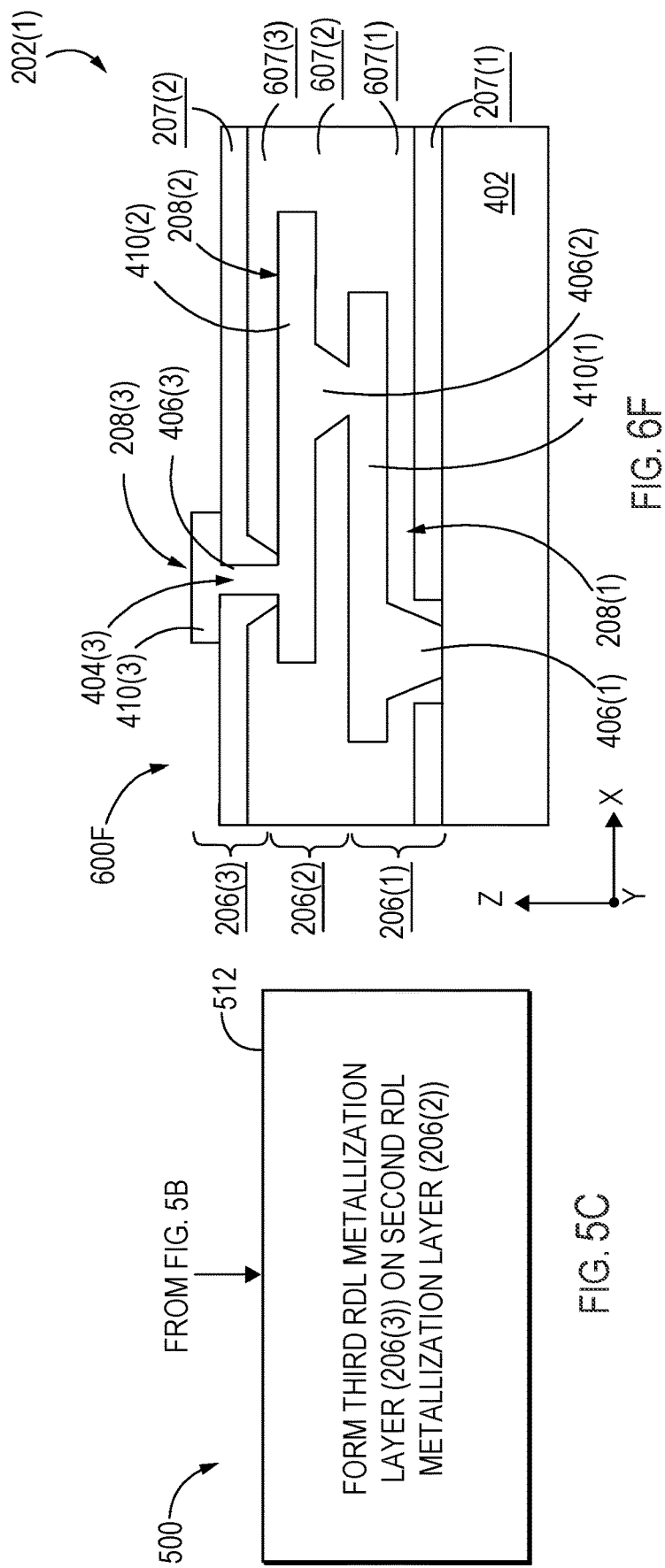

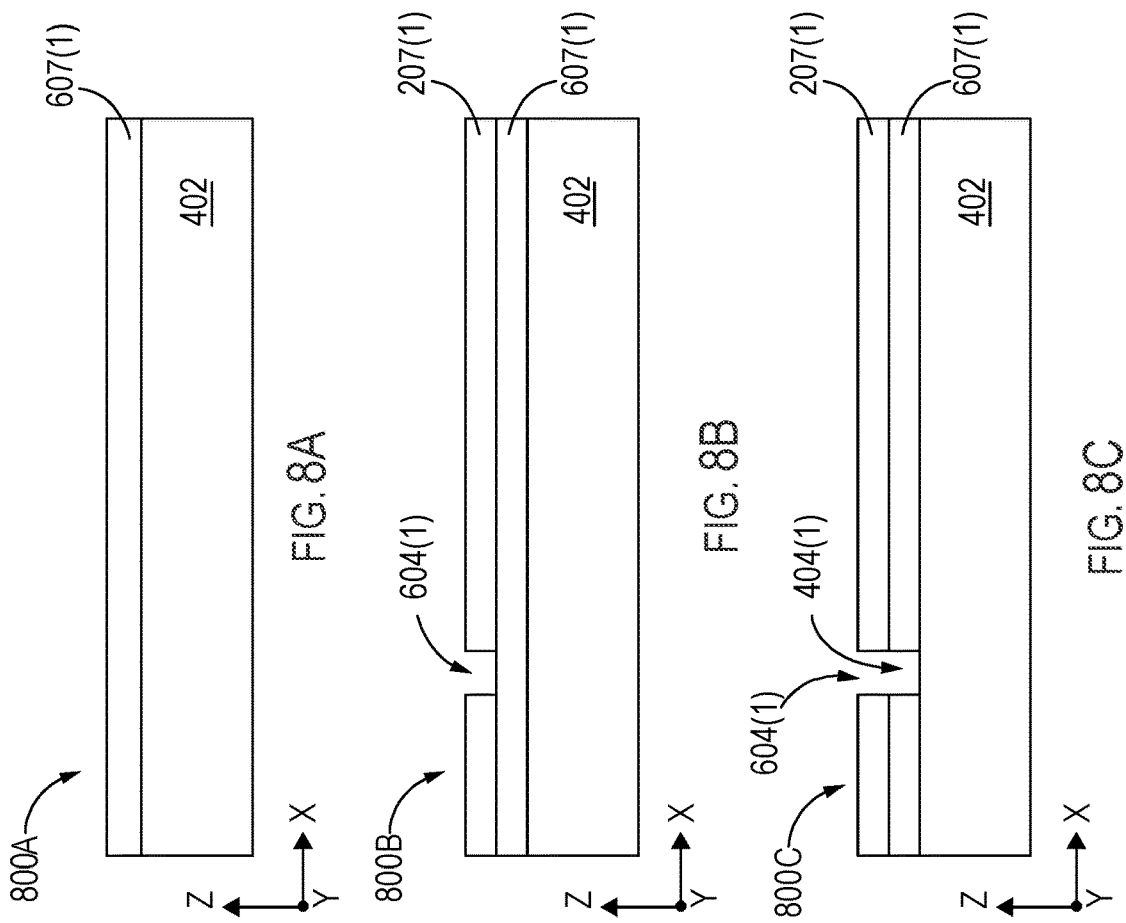
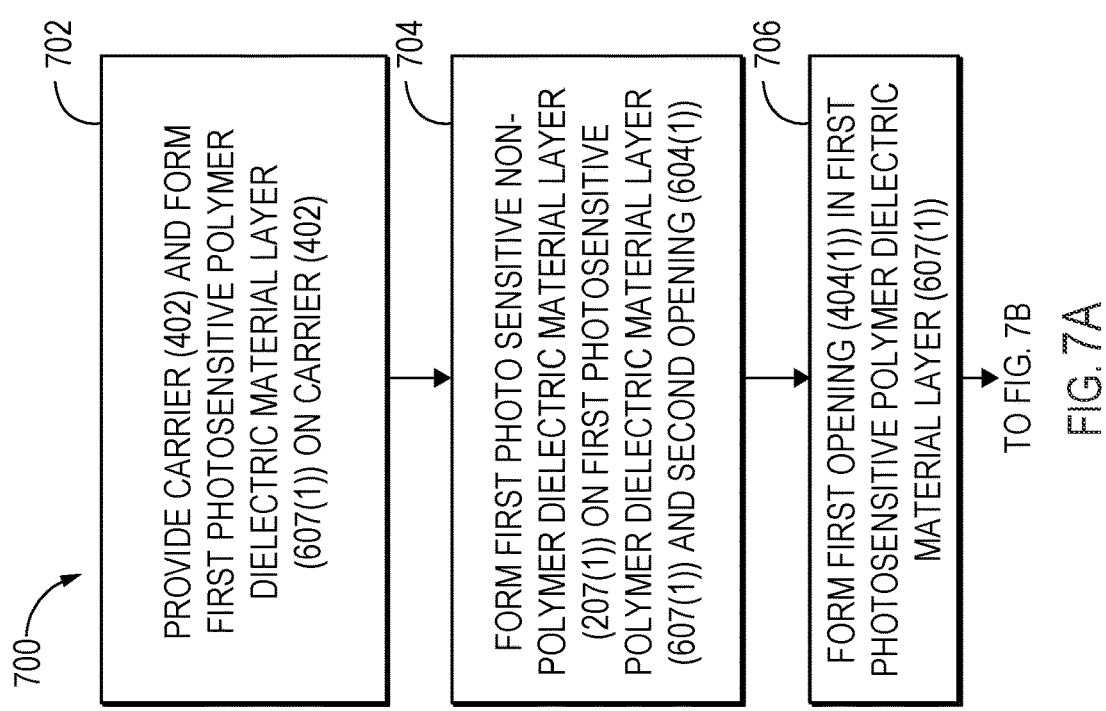

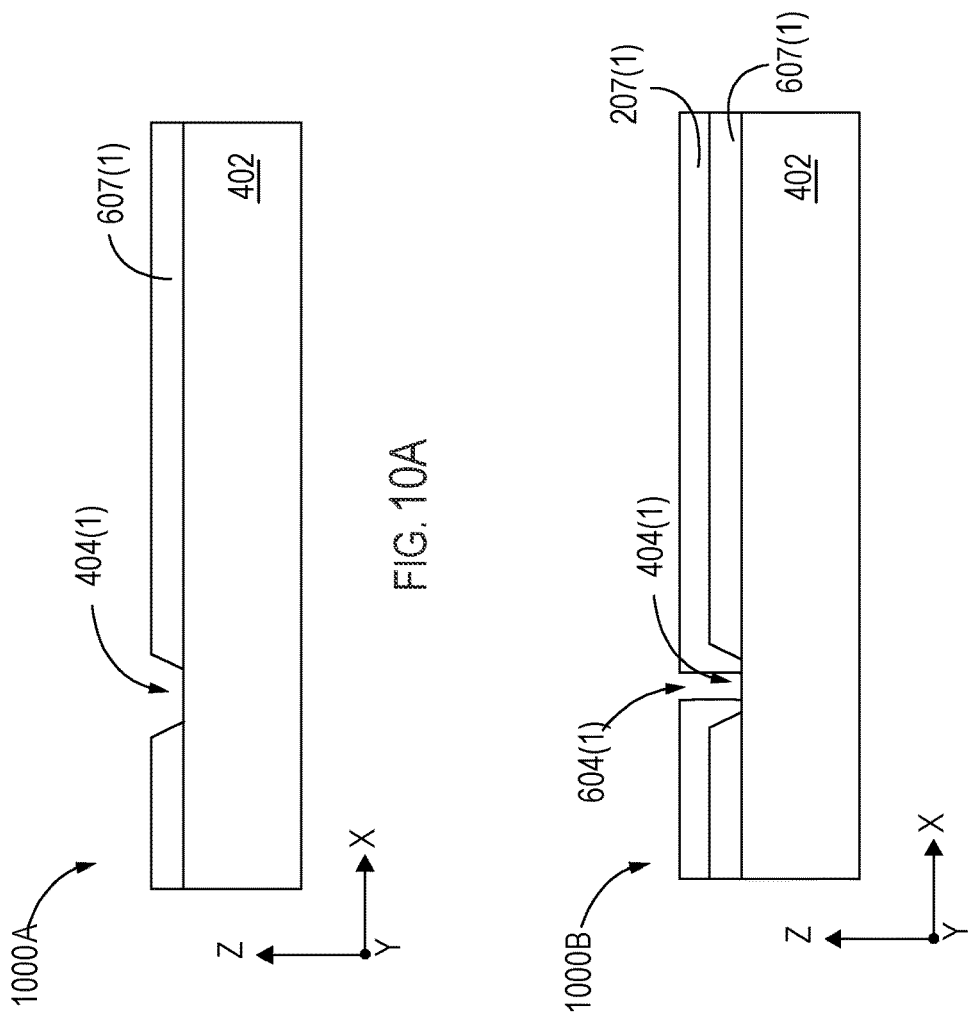
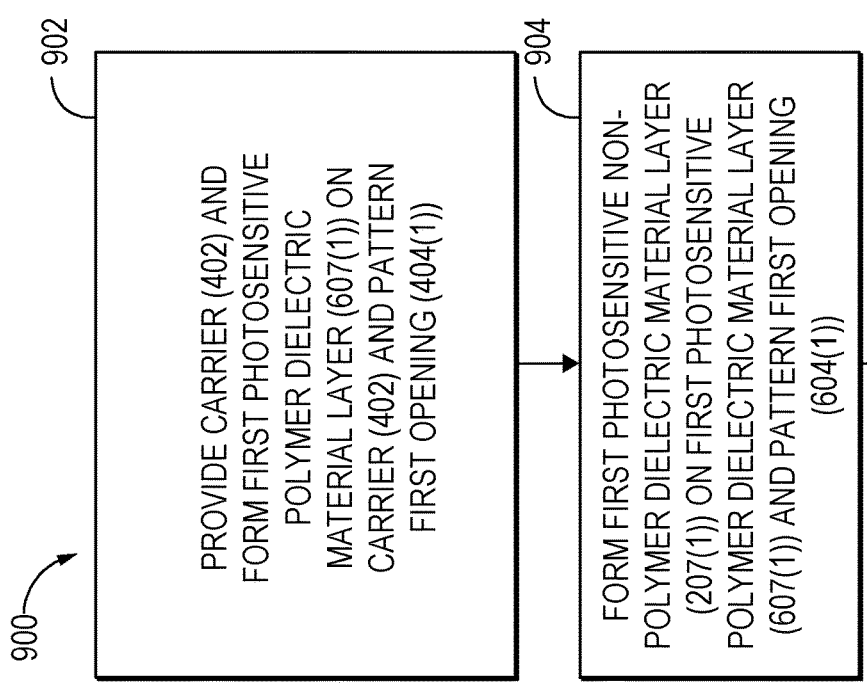

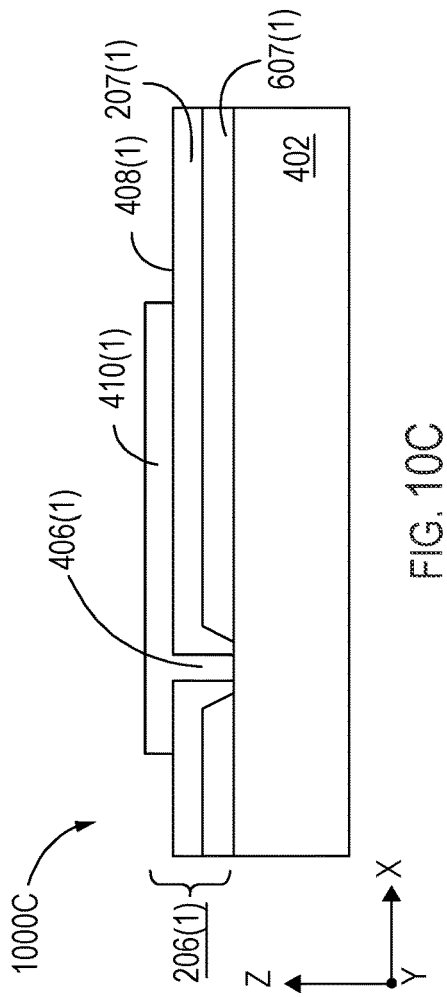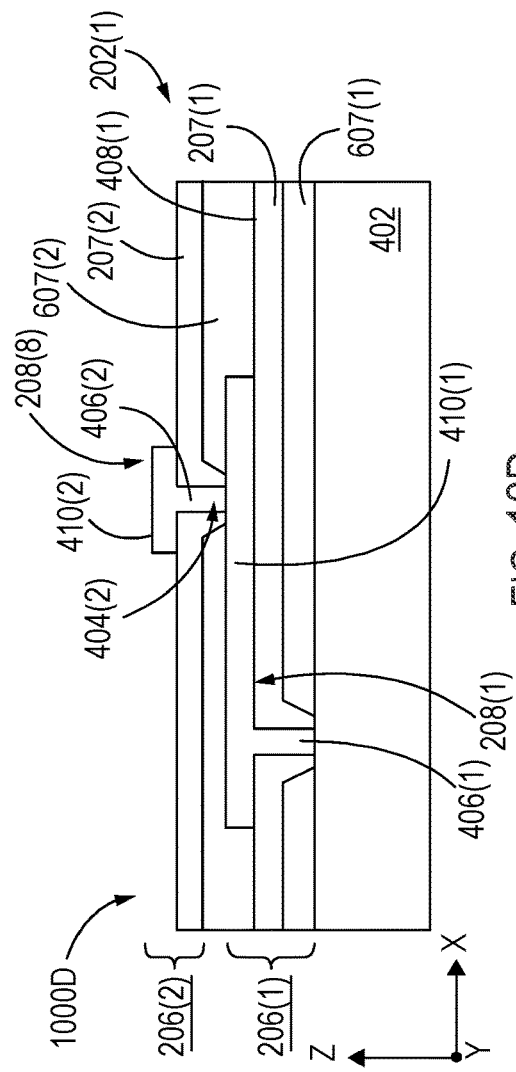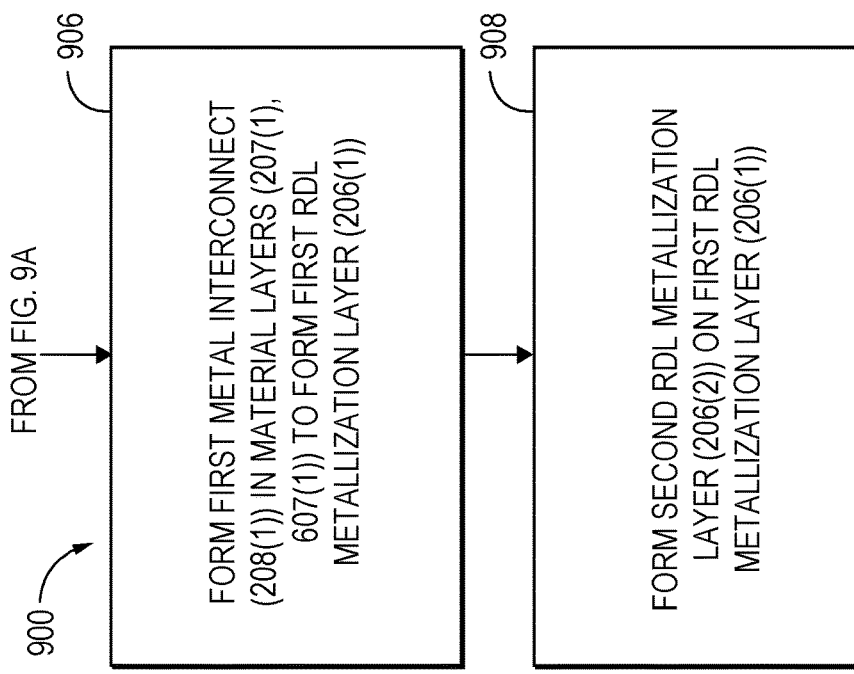

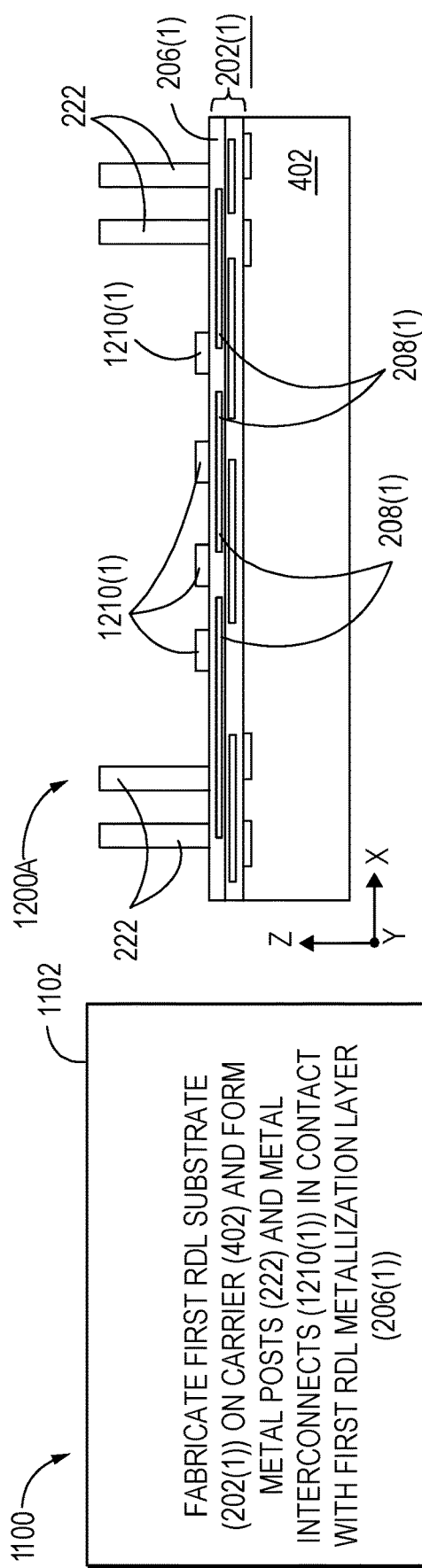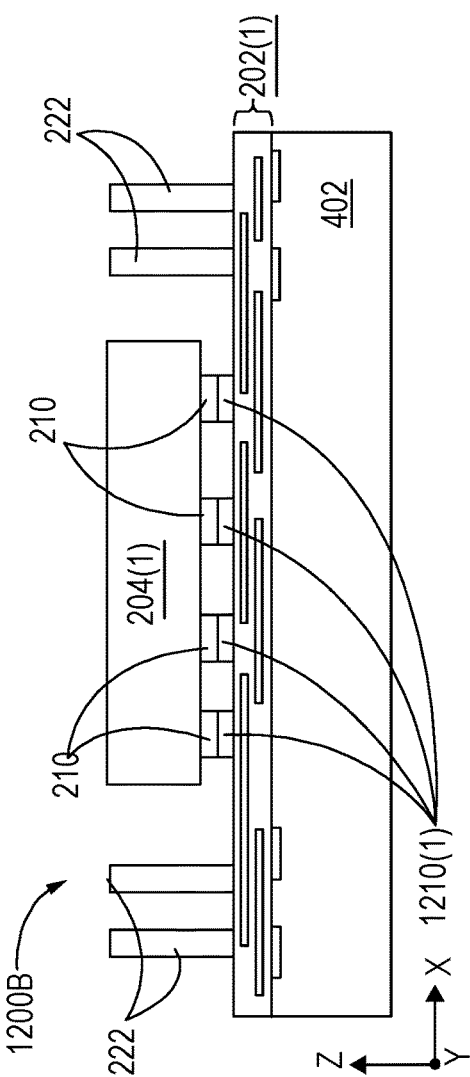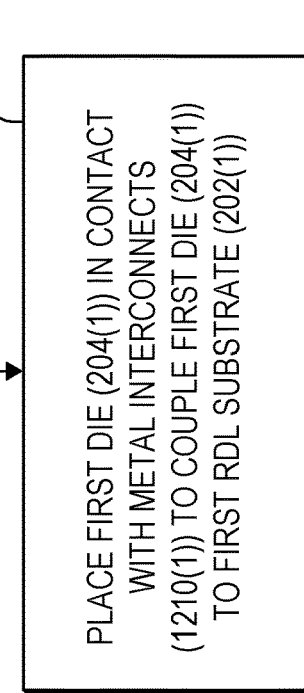

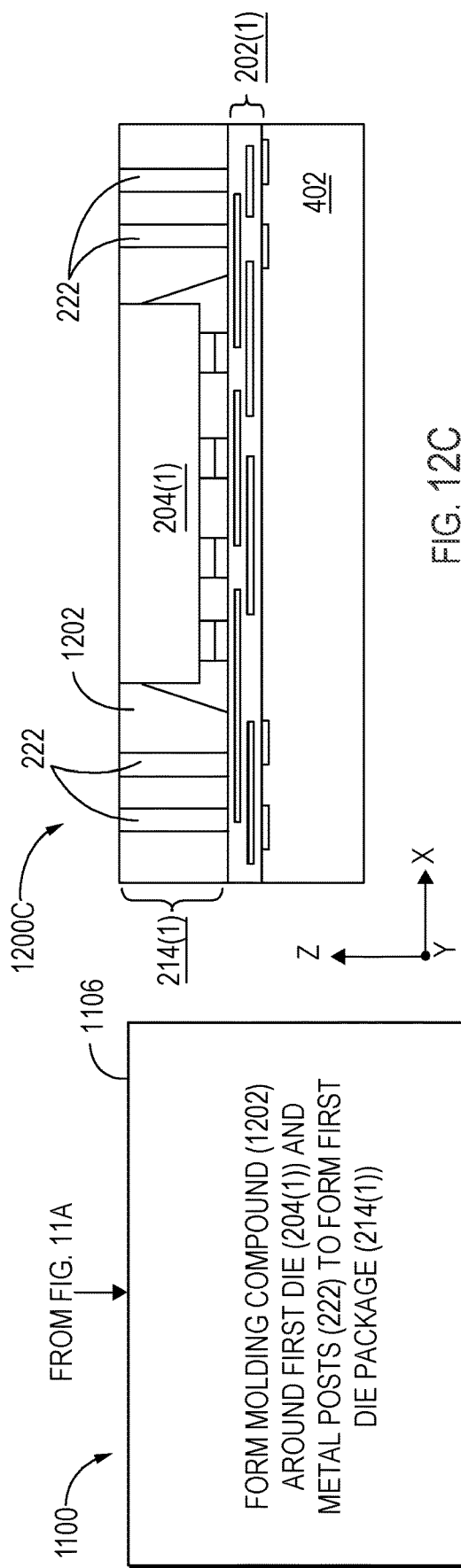
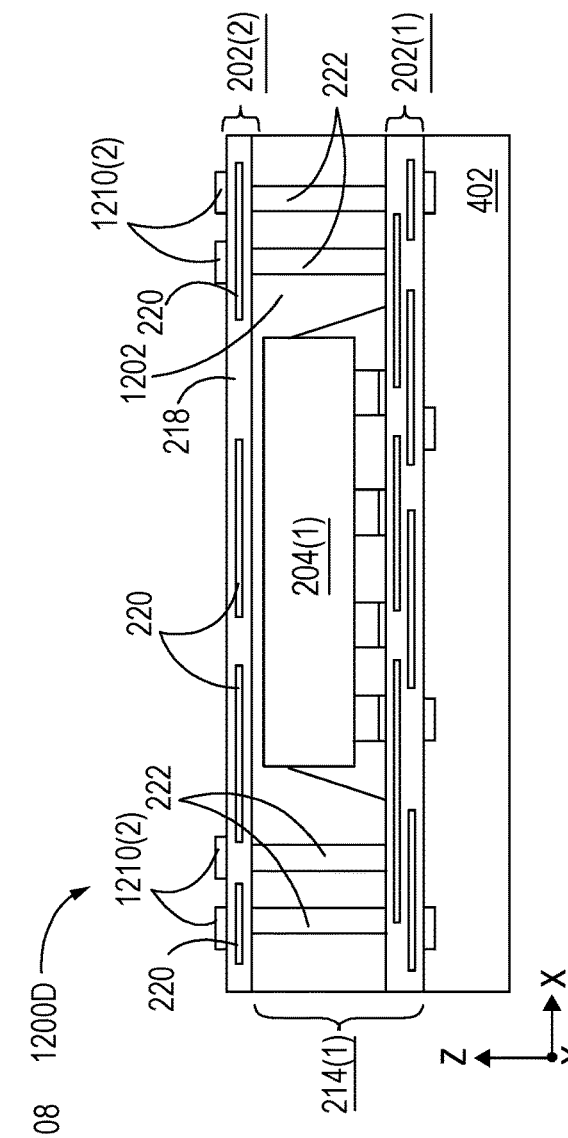

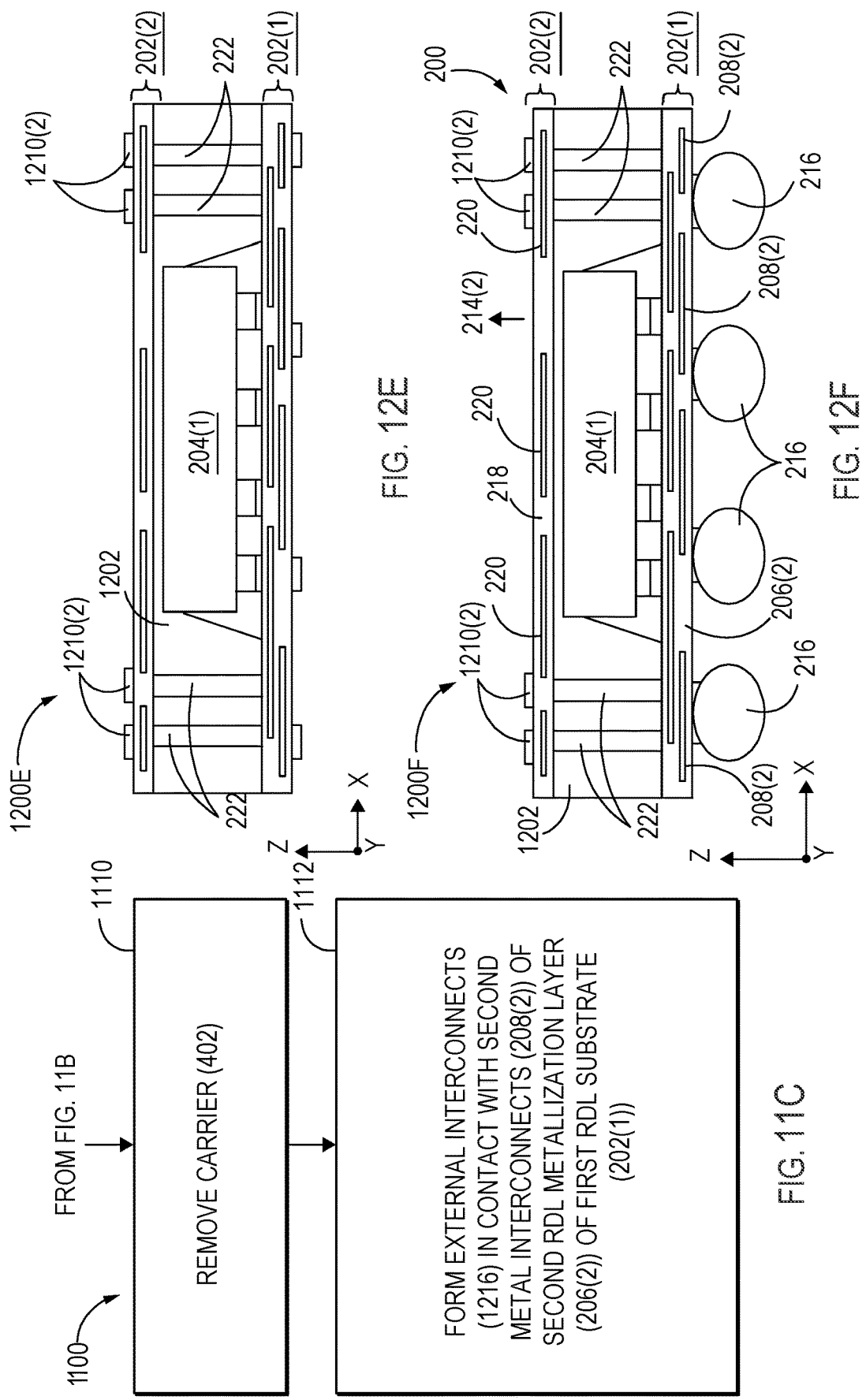

INTEGRATED CIRCUIT (IC) PACKAGE EMPLOYING A RE-DISTRIBUTION LAYER (RDL) SUBSTRATE(S) WITH PHOTOSENSITIVE DIELECTRIC LAYER(S) FOR INCREASED PACKAGE RIGIDITY, AND RELATED FABRICATION METHODS

BACKGROUND

I. Field of the Disclosure

The field of the disclosure relates to integrated circuit (IC) packages, and more particularly to design and manufacture of package-on-package (POP) packages that involve vertical stacking of multiple dies in an IC package.

II. Background

Integrated circuits (ICs) are the cornerstone of electronic devices. ICs are packaged in an IC package, also called a "semiconductor package" or "chip package." The IC package includes one or more semiconductor dice ("dies" or "dice") that are mounted on and electrically coupled to a package substrate to provide physical support and an electrical interface to the die(s). The die(s) is electrically interfaced to metal interconnects (e.g., metal traces, metal lines) in a top metallization layer of the package substrate. The package substrate can also include one or more other metallization layers that include metal interconnects (e.g., metal traces, metal lines) with vertical interconnect accesses (vias) coupling the metal interconnects together between adjacent metallization layers to provide electrical interfaces through the package substrate to the die(s). The package substrate also includes a bottom, outer metallization layer that includes metal interconnects coupled to external metal interconnects (e.g., ball grid array (BGA) interconnects) to provide an external interface between the die(s) in the IC package. The external metal interconnects can also be coupled (e.g., soldered) to traces in a printed circuit board (PCB) to attach the IC package to the PCB to interface its die(s) with the other circuitry coupled to the PCB.

Some IC packages are known as "hybrid" IC packages, which include multiple die packages with respective dies for different purposes or applications. For example, a hybrid IC package may include an application die, such as a communications modem or processor (including a system), and one or more memory dies to provide memory to support data storage and access by the application die. Multiple dies could be disposed in a single die layer and disposed adjacent to each other in a horizontal direction on a package substrate in the IC package. The multiple dies could also be provided in their own respective die packages that are stacked in a vertical direction in what is called a "package-on-package" (POP) arrangement. A POP IC package is a three-dimensional (3D) arrangement and can also be referred to as a 3DIC package. An interposer can be disposed between the die packages to support providing electrical connections between the stacked dies in the package. POP IC packages may be desired to reduce the cross-sectional area of the package. In a POP IC package, a first, bottom die directly supported on a package substrate is electrically coupled through die interconnects to metallization layers of the package substrate to provide signal routing paths for the die in the package substrate. Other stacked dies that are not directly adjacent to the package substrate in the POP package can be electrically coupled to the package substrate by wire bonds and/or intermediate interposers to provide die-to-die (D2D) connections between the multiple stacked dies.

It is desired to provide POP IC packages that can support a high interconnection density to support high interconnection density dies without having to increase in the overall height of the package to conserve area. It is also desired to fabricate POP IC packages in a way that reduces or minimizes warpage to avoid die interconnect breaks and delamination between the dies and underfill mold material surrounding the dies.

SUMMARY OF THE DISCLOSURE

Aspects disclosed herein include integrated circuit (IC) packages employing a re-distribution layer (RDL) substrate(s) with a photosensitive dielectric material layer(s) for increased package rigidity. Related fabrication methods are also disclosed. As an example, the IC package can be a package-on-package (POP) IC package that includes multiple semiconductor die ("die") packages stacked vertically on each other to form a multiple die package. The IC package includes a substrate (RDL substrate) that includes one or more RDL metallization layers that each include a dielectric layer with metal interconnects formed therein for providing signal routing between a die(s) and external interconnects. The RDL metallization layers support smaller line/space (LS) for metal interconnects through re-distribution of metal interconnects to support an increased interconnection density in the IC package. Also, because RDL metallization layers are formed from a thin layer of dielectric material, RDL metallization layers are thinner than other types of substrate layers that have filler materials, such as pre-impregnated (PPG) fiber layers, RDL metallization layers can be used to minimize the height of the substrate of the IC package to conserve area. However, a thinner package substrate may make the IC package more susceptible to warpage that can result in die delamination and/or breakage in die interconnections as examples. Thus, in exemplary aspects, to reduce or minimize warpage of the IC package employing a RDL substrate, the RDL metallization layers of the RDL substrate are formed with one or more photosensitive non-polymer dielectric material layers exhibiting increased rigidity. The photosensitive dielectric non-polymer material is selected to have a higher material modulus for increased stiffness and/or a lower coefficient of thermal expansion (CTE) for reduced thermal contraction and expansion. For example, the photosensitive non-polymer dielectric material may be an inorganic and/or non-polymer-based material (e.g., SiOx, SiN) that has a higher material modulus and/or a lower CTE as opposed to for example, a polymer-based material (e.g., Polyimide) which has less stiffness and a higher CTE. In this manner, when the RDL substrate employing such photosensitive non-polymer dielectric material layer(s) is incorporated as substrate in an IC package, the IC package may be less susceptible to warpage. An IC package that employs a package substrate less susceptible to warpage can result in less complexity in trying to adjust other characteristics of the IC package to control warpage, including density of metal material included in a package substrate, and reduction in asymmetries in CTE between different sections of the IC package.

Also, by the RDL substrate employing a photosensitive non-polymer dielectric material layer(s) for increased rigidity, the same photolithography processes used to fabricate polymer-based RDL metallization layers can be employed, if desired. For example, the RDL metallization layers of the RDL substrate may be formed by a spin-on process in which a spin-on photosensitive non-polymer dielectric material are spun on as a coating layer for providing a thin non-polymer dielectric material layer with optimal planarization, which is then processed to form metal interconnects therein before forming another RDL metallization layer. Spin-on non-polymer dielectric materials may have a lower dielectric constant for increased insulation of metal interconnects, which can reduce parasitic delays within metallization layers.

In this regard, in one exemplary aspect, an IC package is provided. The IC package comprises a first substrate comprising a first RDL metallization layer. The first RDL metallization layer comprises a first photosensitive non-polymer dielectric material layer, and a plurality of first metal interconnects disposed in the first photosensitive dielectric material layer. The IC package also comprises a first die comprising a plurality of first die interconnects each coupled to a first metal interconnect of the plurality of first metal interconnects.

In another exemplary aspect, a method of fabricating an IC package is provided. The method comprises forming a first substrate comprising forming a first re-distribution layer (RDL) metallization layer. Forming the RDL metallization layer comprises forming a first photosensitive non-polymer dielectric material layer, and forming a plurality of first metal interconnects in the first photosensitive non-polymer dielectric material layer. Forming the IC package also comprises coupling each of a plurality of first die interconnects of a first die to a first metal interconnect of the plurality of first metal interconnects.

BRIEF DESCRIPTION OF THE FIGURES

FIGS. 3A-3C is a flowchart illustrating an exemplary fabrication process for fabricating a RDL substrate having one or more RDL metallization layers that include a photosensitive non-polymer dielectric material layer for increased package rigidity, wherein such RDL substrate can be the RDL substrate in the IC package in FIG. 2;

FIGS. 4A-4E are exemplary fabrication stages during fabrication of a RDL substrate according to the exemplary fabrication process in FIGS. 3A-3C;

FIGS. 5A-5C is a flowchart illustrating another exemplary fabrication process for fabricating a hybrid RDL substrate having one or more RDL metallization layers that include photosensitive non-polymer dielectric material and photosensitive polymer dielectric material layers for increased package rigidity, wherein such RDL substrate can be the RDL substrate in the IC package in FIG. 2;

FIGS. 6A-6F are exemplary fabrication stages during fabrication of a RDL substrate according to the exemplary fabrication process in FIGS. 6A-6C;

FIGS. 7A-7B is a flowchart illustrating another exemplary fabrication process for fabricating a hybrid RDL substrate having one or more RDL metallization layers that include interleaved photosensitive non-polymer dielectric material layers and photosensitive polymer dielectric material layers for increased package rigidity, wherein such RDL substrate can be the RDL substrate in the IC package in FIG. 2;

FIGS. 8A-8E are exemplary fabrication stages during fabrication of a RDL substrate according to the exemplary fabrication process in FIGS. 7A-7B;

FIGS. 9A-9B is a flowchart illustrating another exemplary fabrication process for fabricating a hybrid RDL substrate having one or more RDL metallization layers that include interleaved photosensitive non-polymer dielectric material layers and photosensitive polymer dielectric material layers for increased package rigidity, wherein such RDL substrate can be the RDL substrate in the IC package in FIG. 2;

FIGS. 10A-10D are exemplary fabrication stages during fabrication of a RDL substrate according to the exemplary fabrication process in FIGS. 9A-9B;

FIGS. 11A-11C is a flowchart illustrating an exemplary fabrication process for fabricating an IC package that includes a RDL substrate having one or more RDL metallization layers that include a photosensitive non-polymer dielectric material layer for increased package rigidity, wherein the RDL substrate can be, but is not limited to, the RDL substrates in FIGS. 2, 4A-4E, 6A-6F, 8A-8E, 10A-10D, and 12A-12F, wherein the IC package can be, but is not limited to, the IC package in FIG. 2;

FIGS. 12A-12F are exemplary fabrication stages during fabrication of an IC package according to the exemplary fabrication process in FIGS. 11A-11C;

DETAILED DESCRIPTION

Figure 1:
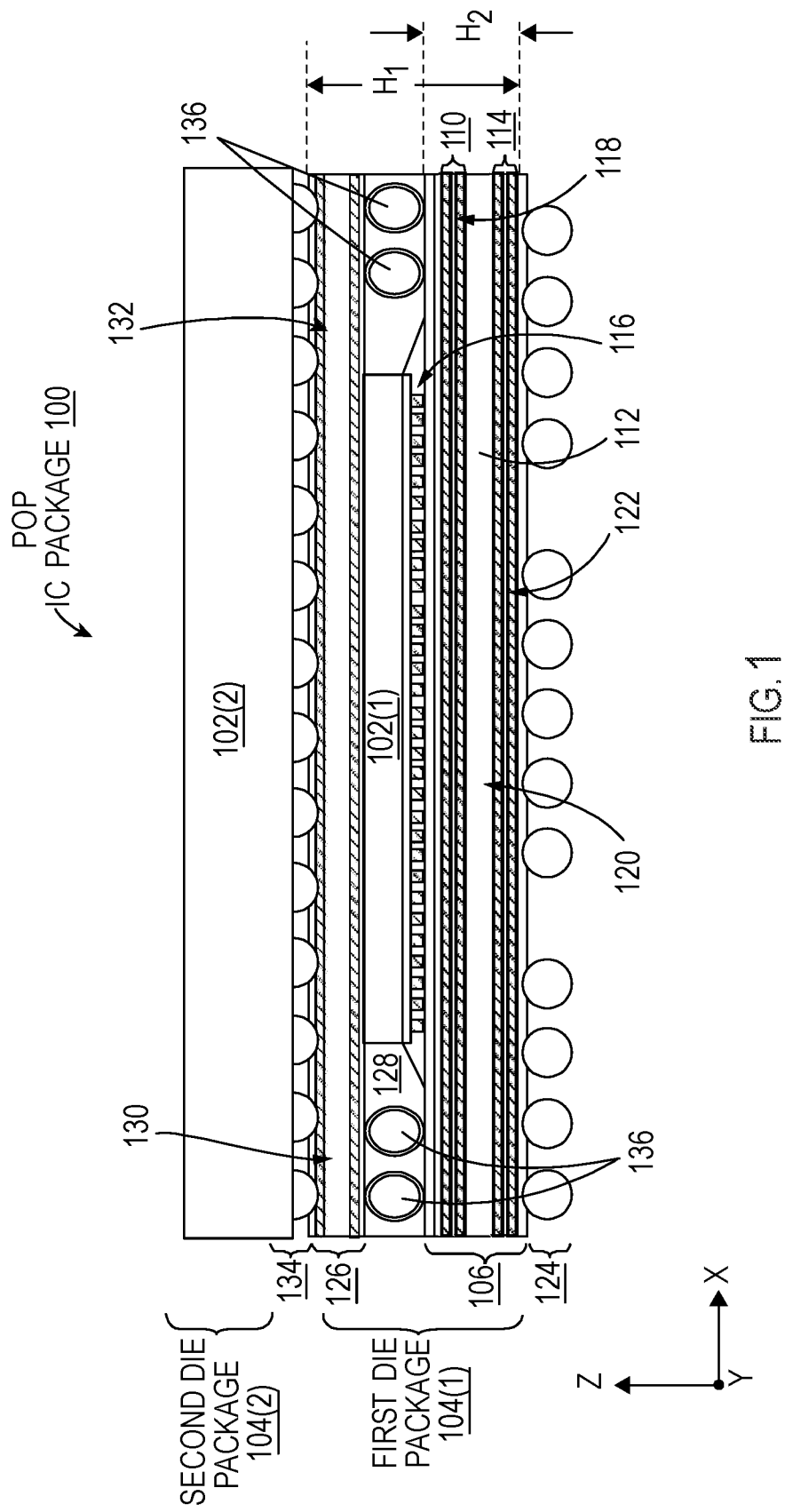
FIG. 1 is a side view of an integrated circuit (IC) package in the form of a package-on-package (POP) IC package that includes a first IC package that includes a first package substrate and a second IC package stacked on the first IC package and electrically coupled to the first IC package through interposer package substrate.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include integrated circuit (IC) packages employing a re-distribution layer (RDL) substrate(s) with a photosensitive dielectric material layer(s) for increased package rigidity. Related fabrication methods are also disclosed. As an example, the IC package can be a package-on-package (POP) IC package that includes multiple semiconductor die ("die") packages stacked vertically on each other to form a multiple die package. The IC package includes a substrate (RDL substrate) that includes one or more RDL metallization layers that each include a dielectric layer with metal interconnects formed therein for providing signal routing between a die(s) and external interconnects. The RDL metallization layers support smaller line/space (LS) for metal interconnects through re-distribution of metal interconnects to support an increased interconnection density in the IC package. Also, because RDL metallization layers are formed from a thin layer of dielectric material, RDL metallization layers are thinner than other types of substrate layers that have filler materials, such as pre-impregnated (PPG) fiber layers, RDL metallization layers can be used to minimize the height of the substrate of the IC package to conserve area. However, a thinner package substrate may make the IC package more susceptible to warpage that can result in die delamination and/or breakage in die interconnections as examples. Thus, in exemplary aspects, to reduce or minimize warpage of the IC package employing a RDL substrate, the RDL metallization layers of the RDL substrate are formed as one or more photosensitive non-polymer dielectric material layers exhibiting increased rigidity. The photosensitive dielectric material is selected to have a higher material modulus for increased stiffness and/or a lower coefficient of thermal expansion (CTE) for reduced thermal contraction and expansion. For example, the photosensitive non-polymer dielectric material may be an inorganic and/or non-polymer-based material (e.g., SiOx, SiN) that has a higher material modulus and/or a lower CTE as opposed to for example, a polymer-based material (e.g., Polyimide) which has less stiffness and a higher CTE. In this manner, when the RDL substrate employing such photosensitive non-polymer dielectric material layers is incorporated as substrate in an IC package, the IC package may be less susceptible to warpage. An IC package that employs a package substrate less susceptible to warpage can result in less complexity in trying to adjust other characteristics of the IC package to control warpage, including density of metal material included in a package substrate, and reduction in asymmetries in CTE between different sections of the IC package.

Also, by the RDL substrate employing photosensitive non-polymer dielectric material layers for increased rigidity, the same photolithography processes used to fabricate polymer RDL metallization layers can be employed, if desired. For example, the RDL metallization layers of the RDL substrate may be formed by a spin-on process in which a spin-on photosensitive non-polymer dielectric material are spun on as a coating layer for providing a thin dielectric material layer with optimal planarization, which is then processed to form metal interconnects therein before forming another RDL metallization layer. Spin-on dielectric materials may have a lower dielectric constant for increased insulation of metal interconnects, which can reduce parasitic delays within metallization layers.

Before discussing examples of IC packages employing a RDL substrate(s) with photosensitive non-polymer dielectric material layers for increased package rigidity starting at FIG. 2, an example of an IC package in the form of a POP IC package is first discussed below with regard to FIG. 1.

In this regard, FIG. 1 is a side view of an exemplary POP IC package 100 ("IC package 100") that is a 3D stacked-die IC package. The IC package 100 includes a first and second dies 102(1), 102(2) that are included in respective die packages 104(1), 104(2) that are stacked on top of each other in the vertical direction (Z-axis direction). The first die package 104(1) includes the first die 102(1) coupled to a package substrate 106. In this example, the package substrate 106 includes a first, upper/outer metallization layer 110 disposed adjacent to a second, internal metallization layer 112, which is adjacent to a third, lower metallization layer 114. The metallization layers 110, 112, 114 provide an electrical interface for signal routing to the first die 102(1). The first die 102(1) is coupled to die interconnects 116 (e.g., raised metal bumps) that are electrically coupled to metal interconnects 118 (e.g., metal traces, metal lines, metal vias) in the upper metallization layer 110. The metal interconnects 118 in the upper metallization layer 110 are coupled to metal interconnects 120 in the second, internal metallization layer 112, which can be coupled to metal interconnects 122 in the third metallization layer 114. In this manner, the package substrate 106 provides interconnections between its metallization layers 110, 112, 114 for signal routing to the first die 102(1). External interconnects 124 (e.g., solder bumps, metal bumps, ball grid array (BGA) interconnects) are coupled to the metal interconnects 122 in the lower, third metallization layer 114 to provide interconnections through the package substrate 106 to the first die 102(1).

Also in the IC package 100 in FIG. 1, to provide a 3D stacking of dies, the second die package 104(2) is provided and coupled to the first die package 104(1). For example, the first die 102(1) may include an application processor, and the second die 102(2) may be a memory die, such as a dynamic random access memory (DRAM) die that provides memory support for the application processor. In this regard, in this example, the first die package 104(1) also includes an interposer substrate 126 that is disposed on a package mold 128 encasing the first die 102(1). The interposer substrate 126 also includes one or more metallization layers 130 that each includes metal interconnects 132 to provide interconnections to the second die 102(2) in the second die package 104(2). The second die package 104(2) is physically and electrically coupled to the first die package 104(1) by being coupled through external interconnects 134 (e.g., solder bumps, metal bumps, BGA interconnects) to the interposer substrate 126. The external interconnects 134 are coupled to the metal interconnects 132 in the interposer substrate 126.

As shown in FIG. 1, the overall height $H_1$ of the IC package 100 in the vertical direction (Z-axis direction) is controlled by the height of the first and second die packages 104(1), 104(2), the interposer substrate 126, and the package substrate 106. It is desired to fabricate the IC package 100 in a manner that reduces or minimizes warpage to avoid die interconnect breaks and delamination between the first and second dies 102(1), 102(2) and underfill mold material surrounding the first and second dies 102(1), 102(2). If the materials selected for fabrication of the IC package 100 have too high of a CTE, thermal conditions can more likely result in thermal contraction and expansion that can result in warpage. Further, mismatches in CTE between the package substrate 106, the first die 102(1), the interposer substrate 126, and the second die package 104(2) can also result in warpage in the IC package 100 in an undesired manner. Thus, as an example, to increase or maintain rigidity of the IC package 100, the package substrate 106 may be made from materials that have increased stiffness (i.e., an increased modulus of elasticity and/or a lower CTE). For example, the metallization layers 110, 112, 114 of the package substrate 106 may be fabricated from substrate layers that have filler materials to increase their firmness. For example, the metallization layers 110, 112, 114 of package substrate 106 may be provided as PPG fiber layers that are laminated together during fabrication of the package substrate 106. However, it may also be desired, for example, to the reduce the height $H_2$ of the package substrate 106 to reduce the overall height $H_1$ of the IC package 100. Reducing the height $H_2$ of the package substrate 106 may decrease the stiffness of the package substrate 106 and thus make the IC package 100 more susceptible to warpage in an undesired manner.

Figure 2:
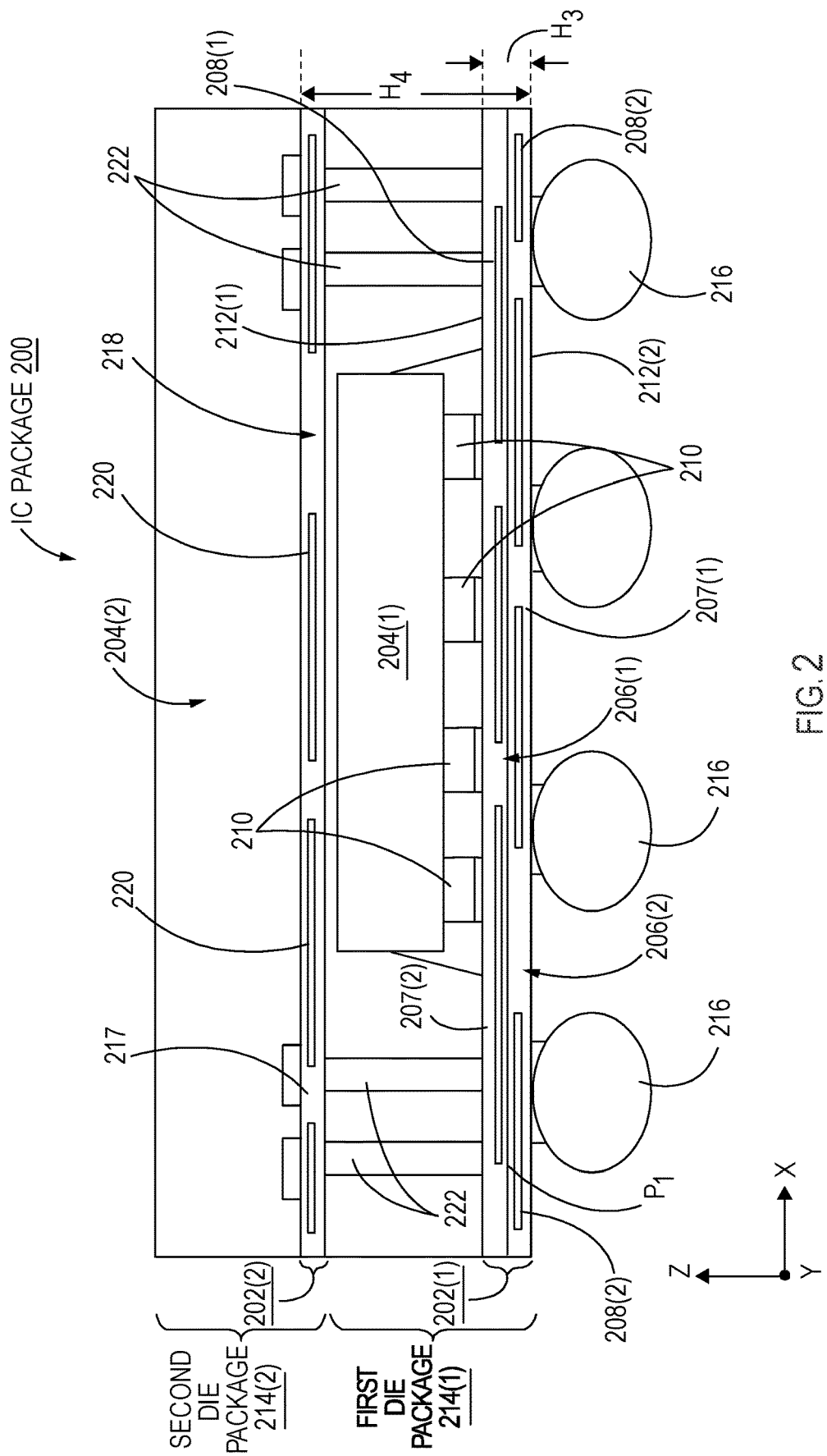
FIG. 2 is a side view of an exemplary IC package that includes a substrate (re-distribution layer (RDL) substrate) having one or more RDL metallization layers that include a photosensitive non-polymer dielectric material layer for increased package rigidity.

FIG. 2 is a side view of an exemplary IC package 200 that includes a first package substrate 202(1) in the form of a first RDL substrate (also referred to herein as "first package substrate 202(1)" or "first RDL substrate 202(1)") to reduce the height $H_3$ of the first RDL substrate 202(1), but yet also support higher interconnect density to support a higher interconnect count of a first die 204(1). As discussed in more detail below, the first RDL substrate 202(1) that includes one or more RDL metallization layers 206(1), 206(2) each include respective first and second photosensitive non-polymer dielectric material layers 207(1), 207(2) with first and second metal interconnects 208(1), 208(2) (e.g., metal traces, metal lines, metal vias) formed therein. The RDL metallization layers 206(1), 206(2) are parallel to each other and each extend in first, horizontal directions (X- and Y-axes directions) in a first plane $P_1$. Die interconnects 210 (e.g., metal bump) couple the first die 204(1) to the first metal interconnects 208(1) exposed from a first surface 212(1) of the first, upper RDL metallization layer 206(1) of the first RDL substrate 202(1) to provide an electrical connection and signal routing paths between the first die 204(1) and the first RDL substrate 202(1). The first die 204(1) coupled to the first RDL substrate 202(1) form a first die package 214(1). The first and second metal interconnects 208(1), 208(2) are formed in their respective RDL metallization layers 206(1), 206(2) to re-distribute signal routing paths in a first, horizontal direction(s) (X- and/or Y-axes directions) from the die interconnects 210 and internally between first and second metal interconnects 208(1), 208(2) in adjacent RDL metallization layers 206(1), 206(2), to provide signal routing between the first die 204(1) and external interconnects 216 (e.g., solder bumps, metal bumps, BGA interconnects) coupled to the second metal interconnects 208(2) exposed from the second surface 212(2) of the lower, second RDL metallization layer 206(2). In this manner, the re-distribution of the signal routing paths through redistribution of the first and second metal interconnects 208(1), 208(2) in the first RDL substrate 202(1) can support an increased interconnection density in the first RDL substrate 202(1). Also, as discussed in more detail below, the manner in which the first RDL substrate 202(1) is fabricated can allow for smaller line/space (LS) between first and second metal interconnects 208(1), 208(2) in a given respective RDL metallization layer 206(1), 206(2) to support an increased interconnection density in the first RDL substrate 202(1).

Also, because RDL metallization layers 206(1), 206(2) are formed from a thin layer of dielectric material, the RDL metallization layers 206(1), 206(2) are thinner than other types of substrate layers that have filler materials, such as PPG fiber layers, which may include the metallization layers 110, 112, 114 in the package substrate 106 in FIG. 1. Thus, the RDL metallization layers 206(1), 206(2) in the first RDL substrate 202(1) of the IC package 200 can be used to minimize the height $H_3$ of the first RDL substrate 202(1), to then reduce the overall height $H_4$ of the IC package 200 to conserve area. However, by forming the first RDL substrate 202(1) out of thinner RDL metallization layers 206(1), 206(2) than the overall height $H_3$ of the first RDL substrate 202(1), the first RDL substrate 202(1) may be more susceptible to warpage. This can in turn make the IC package 200 as a whole more susceptible to warpage.

Also, as shown in the IC package 200 in FIG. 2, the IC package 200 supports an additional second die package 214(2) stacked above the first die package 214(1) in a second, vertical direction (Z-axis direction) to provide a POP IC package configuration. Thus, it is also necessary to provide a method to provide interconnections between the second die package 214(2) and the first RDL substrate 202(1). In this regard, the second die package 214(2) also includes a second RDL substrate 202(2) that is similar to the first RDL substrate 202(1). The second RDL substrate 202(2) includes an RDL metallization layer 218 that includes a photosensitive non-polymer dielectric material layer 217 with metal interconnects 220 formed therein. The metal interconnects 220 are formed in a RDL metallization layer 218 to re-distribute signal routing paths in the first, horizontal direction(s) (X- and/or Y-axes directions) between the second die 204(2) in the second die package 214(2) and the external interconnects 216. The features discussed above with regard to the first RDL substrate 202(1) are also applicable to the second RDL substrate 202(2). Metal posts 222 or metal pillars 222 are disposed in the first die package 214(1) adjacent to the first die 204(1) and coupled to and between the first and second RDL substrates 202(1), 202(2) (and between and to their respective first metal interconnects 208(1), 220 to provide signal routing paths from the second RDL substrate 202(2) to the first RDL substrate 202(1) and/or then to the external interconnects 216. The second die package 214(2) may also have an RDL substrate like the first and/or second RDL substrate 202(1), 202(2) that is coupled to the second RDL substrate 202(2) to provide connections between the second die package 214(2) (and its second die 204(2)) and the first RDL substrate 202(1) and/or the external interconnects 216.

The first and second RDL substrates 202(1), 202(2) in the IC package 200 being thinner in the second, vertical direction (Z-axis direction) may make the IC package 200 more susceptible to warpage that can result in delamination of the first and second dies 204(1), 204(2) and/or breakage in their die interconnections, as examples. Thus, as an example, in the IC package 200 in FIG. 2, to reduce or minimize warpage of the IC package 200, the first and second RDL metallization layers 206(1), 206(2) and the RDL metallization layer 218 of the first and/or second RDL substrates 202(1), 202(2) are formed as photosensitive non-polymer dielectric material layers exhibiting increased rigidity. As discussed in more detail below, a photosensitive non-polymer dielectric material is selected for the first and second RDL metallization layers 206(1), 206(2) and the RDL metallization layer 218 of the first and/or second RDL substrates 202(1), 202(2) to have a higher material modulus for increased stiffness and/or a lower CTE for reduced thermal contraction and expansion. For example, the photosensitive non-polymer dielectric material may be an inorganic and/or non-polymer-based material (e.g., Silicon Oxide (SiOx), Silicon Nitride (SiN)) that has a higher material modulus and/or a lower CTE as opposed to, for example, a polymer-based material (e.g., Polyimide) which has less stiffness and a higher CTE. For example, photosensitive non-polymer dielectric material used to fabricate the photosensitive non-polymer dielectric material layers 207

(1), 207(2), 217 may be an inorganic material in which the absence of carbon atoms results in a higher material modulus and/or a lower CTE. As another example, photosensitive non-polymer dielectric material used to fabricate the photosensitive non-polymer dielectric material layers 207(1), 207(2), 217 may be a non-polymer that results in higher material modulus and/or a lower CTE. Also, by the first and/or second RDL substrates 202(1), 202(2) employing photosensitive non-polymer dielectric material layers for increased rigidity, the same photolithography processes used to fabricate conventional RDL metallization layers (e.g., that use softer, less firm polymer materials for dielectric layers) can be employed, if desired. For example, the photosensitive non-polymer dielectric material layer (SOD) 207(1), 207(2), 217 of the respective RDL metallization layers 206(1), 206(2), 218 of the first and/or second RDL substrates 202(1), 202(2) may be formed by a spin-on process as a spin-on photosensitive non-polymer dielectric material layer 207(1), 207(2), 217 in which a spin-on photosensitive non-polymer dielectric material is spun on as a coating layer for providing a thin dielectric material layer with optimal planarization. SOD materials may have a lower dielectric constant for increased insulation of metal interconnects, which can reduce parasitic delays within RDL metallization layers 206(1), 206(2), 218. Spin coating is a procedure that involves evaporating a coating material onto a surface and then spinning it at high speed, to make it spread thin. SOD materials can include a coating material applied in a Silicon Dioxide thin film process to form the photosensitive non-polymer dielectric material layers 207(1), 207(2), 217 as photosensitive non-polymer dielectric films to insulate metal interconnects 208(1), 208(2), 220 between RDL metallization layers 206(1), 206(2), 218. An existing method for Silicon Dioxide thin film process uses chemical vapor deposition, but as the patterning of the metal interconnects 208(1), 208(2), 220 and their L/S (e.g., a pattern resolution of approximately one (1) micrometer (μm) becomes finer, a spin coating process can yield better planarization without voids.

The SOD non-polymer dielectric material layer, being photosensitive, can then reprocess through lithography processes to form openings in the photosensitive non-polymer dielectric material layers 207(1), 207(2), 217 in which respective metal interconnects 208(1), 208(2), 220 are formed therein in the desired location according to the signal routing layout of the first and/or second RDL substrates 202(1), 202(2). This process can be repeated by laying or spinning down dielectric material layers and then processing such layers to form metal interconnects to build RDL substrates with multiple RDL metallization layers as desired.

In this manner, when the first and/or second RDL substrates 202(1), 202(2) employing such photosensitive non-polymer dielectric material layers is incorporated in the IC package 200, the IC package 200 may be less susceptible to warpage. An IC package that employs a package substrate less susceptible to warpage can result in less complexity in trying to adjust other characteristics of the IC package to control warpage (known as "tuning"), including density of metal material included in a package substrate, and reduction in asymmetries in CTE between different sections of the IC package. Reducing or mitigating warpage issues also allows a RDL substrate, like the first and second RDL substrates 202(1), 202(2) in the IC package 200 for example, to be fabricated separately or within a die package and then provided separately to another integrator or customer who may then use that RDL substrate or die package to mount to their circuit board and/or add additional die packages to form a POP IC package. This is because with the increased rigidity of the first and second RDL substrates employing photosensitive non-polymer dielectric material layers for the RDL metallization layers, the RDL substrate is less susceptible to damage during fabrication and/or if fabricated and supply separately outside of other components that may otherwise add rigidity and stability to the RDL substrate.

As an example, the photosensitive non-polymer dielectric material layers 207(1), 207(2), 217 may be made from a dielectric material that results in such layers having an elastic modulus between 63 and 77 GigaPascals (GPa) (e.g., 70 GPa). This is compared to, for example, a polyimide dielectric material that is a softer material and that may have an elastic modulus between 2 and 3.5 GPa, which may result in an undesired warpage in the IC package 200 if used to form the photosensitive non-polymer dielectric material layers 207(1), 207(2), 217.

As another example, the photosensitive non-polymer dielectric material layers 207(1), 207(2), 217 may be made from a dielectric material that has a CTE less than or equal to one (1) parts per million (ppm) per degree Celsius (C)(ppm/° C.) to be less susceptible to thermal contraction and expansion to reduce or minimize warpage. This is compared to, for example, a polyimide dielectric material that is a softer material and that may have a CTE of 55 ppm/° C., which may result in an undesired warpage in the IC package 200 if used to form the photosensitive non-polymer dielectric material layers 207(1), 207(2), 217.

As another example, the photosensitive non-polymer dielectric material layers 207(1), 207(2), 217 may be made from a dielectric material that has thermal stability up to 900 degrees Celsius (° C.) to be less susceptible to damage during a photolithography curing process during fabrication. This is compared to, for example, a polyimide dielectric material that is a softer material and that may have a thermal stability only up to 400° C.

As another example, the photosensitive non-polymer dielectric material layers 207(1), 207(2), 217 may be made from a dielectric material that has a curing temperature (e.g., 200-300° C.) comparable to the curing temperature of other less stiff photosensitive non-polymer dielectric material layers (e.g., 200-390° C.) so that the same fabrication processes can be employed to fabricate the first and/or second RDL substrates 202(1), 202(2).

As another example, the photosensitive non-polymer dielectric material layers 207(1), 207(2), 217 may be made from a dielectric material that has a dielectric constant (e.g., 3-4) comparable to the dielectric constant of other less stiff photosensitive non-polymer dielectric material layers (e.g., 3.3). In this manner, the photosensitive non-polymer dielectric material layers 207(1), 207(2), 217 can provide similar high quality insulating properties between their respective metal interconnects 208(1), 208(2), 220 to reduce parasitic delays in routed signals in the first and/or second RDL substrates 202(1), 202(2).

As another example, the photosensitive non-polymer dielectric material layers 207(1), 207(2), 217 may be made from a dielectric material that has a residue stress (e.g., 20 MegaPascals (MPa)) comparable to the residue stress of other less stiff photosensitive non-polymer dielectric material layers (e.g., 35 MPa). The photosensitive non-polymer dielectric material layers 207(1), 207(2), 217 may be made from a dielectric material that has a thermal conductivity of approximately 1.0 to 1.2 Watts/per meter-Kelvin (W/mK) to provide good thermal conductivity for heat dissipation.

Figure 3B:
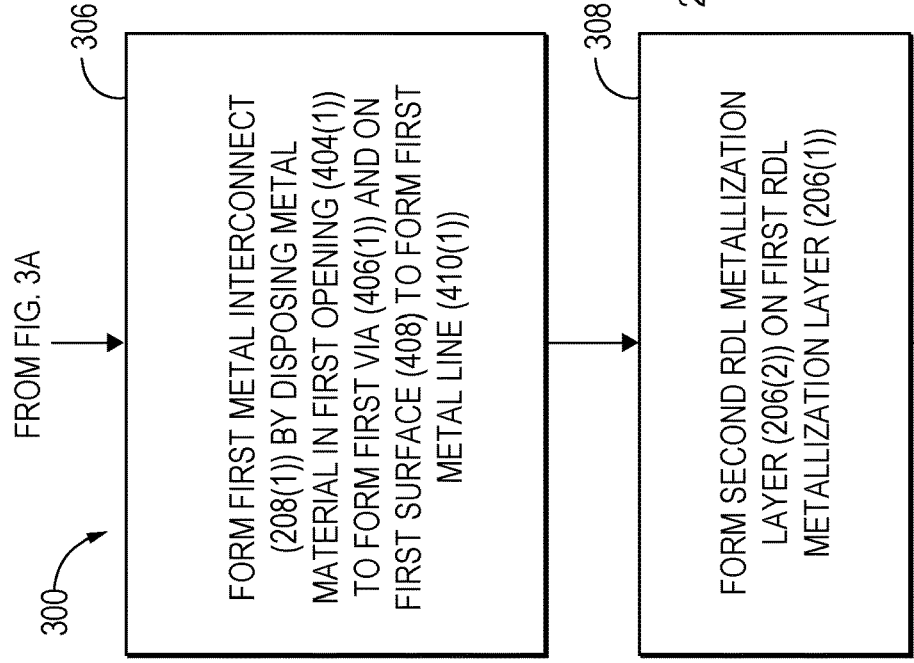
Figure 3C:

Fabrication processes can be employed to fabricate a RDL substrate having one or more RDL metallization layers that include a photosensitive non-polymer dielectric material layer for increased package rigidity, including but not limited to the first and second RDL substrate 202(1), 202(2) in FIG. 2. In this regard, FIGS. 3A-3C is a flowchart illustrating an exemplary fabrication process 300 of fabricating a RDL substrate having one or more RDL metallization layers that include a photosensitive non-polymer dielectric material layer for increased package rigidity, including but not limited to the first and second RDL substrate 202(1), 202(2) in FIG. 2. The fabrication process 300 in FIG. 3 is discussed with regard to the first RDL substrate 202(1) in the IC package 200 in FIG. 2, but note that the fabrication process 300 in FIGS. 3A-3C is not limited to fabricating the first and/or second RDL substrates 202(1), 202(2) in FIG. 2. FIGS. 4A-4E are exemplary fabrication stages 400A-400E during fabrication of the first RDL substrate 202(1) according to the fabrication process 300 in FIGS. 3A-3C.

In this regard, as shown in the exemplary fabrication stage 400A in FIG. 4A, a first step in the fabrication process 300 is to provide a carrier wafer 402 ("carrier 402"), which may be a glass or silicon wafer or substrate for example (block 302 in FIG. 3A). The carrier 402 is to provide a support structure in which to form the first RDL substrate 202(1). Then, as shown in the exemplary fabrication stage 400B in FIG. 4B, a next step in the fabrication process 300 can be to form the first RDL metallization layer 206(1) by forming a first photosensitive non-polymer dielectric material layer 207(1) onto the carrier 402 that will serve as a dielectric layer of a first RDL metallization layer 206(1) of the first RDL substrate 202(1) (block 304 in FIG. 3A). For example, the first photosensitive non-polymer dielectric material layer 207(1) may be formed as a spun-on dielectric material on the carrier 402 as discussed above, and then cured. A photolithography process is used to pattern a first opening 404(1) in the first photosensitive non-polymer dielectric material layer 207(1) in which the first metal interconnect 208(1) will be formed I the first RDL metallization layer 206(1) (block 304 in FIG. 3A).

Figure 4C:
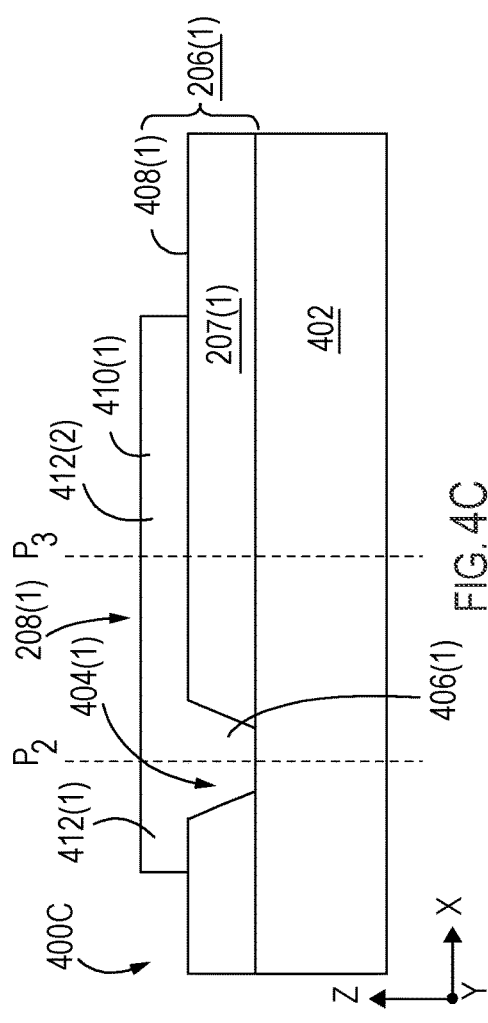

Then, as shown in the exemplary fabrication stage 400C in FIG. 4C, a next step in the fabrication process 300 can be to form the first metal interconnect 208(1) in the first photosensitive non-polymer dielectric material layer 207(1) to form the first RDL metallization layer 206(1) (block 306 in FIG. 3B). In this example, the first metal interconnect 208(1) is formed by depositing a metal material (e.g., copper) in the first opening 404(1) such that the metal material fills the first opening 404(1) to form a first via 406(1) (block 306 in FIG. 3B). Excess metal material is formed on the first, top surface 408(1) of the first photosensitive non-polymer dielectric material layer 207(1), which is then processed to form a first metal line 410(1) as part of the first metal interconnect 208(1) (block 306 in FIG. 3B). This structure redistributes the location of the first metal interconnect 208(1) from the first via 406(1) laterally in a horizontal direction (X- and/or Y-axis directions) in the first RDL metallization layer 206(1). The first metal line 410(1) has a first metal line portion 412(1) that intersects a second, vertical plane $P_2$ (in the Z-axis direction) also intersecting the first via 406(1) to be coupled to the first via 406(1). The first metal line 410(1) also has a second metal line portion 412(2) that intersects a third, vertical plane $P_3$ (in the Z-axis direction) that does not intersect the first via 406(1) so as to re-distribute the connection to the first via 406(1).

Figure 4D:
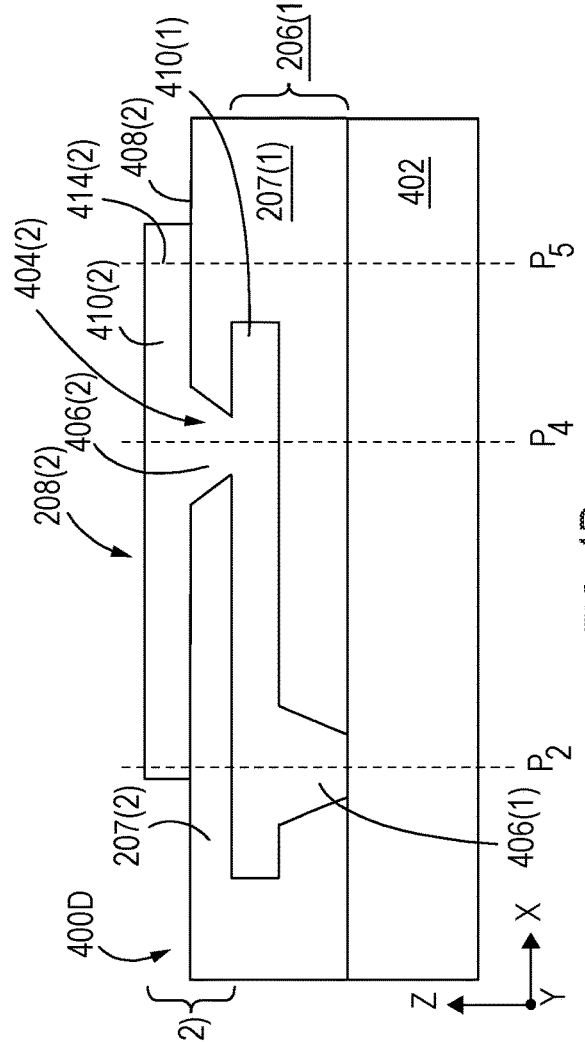

Then, as shown in the exemplary fabrication stage 400D in FIG. 4D, a next step in the fabrication process 300 can be to form the second RDL metallization layer 206(2) adjacent to the first RDL metallization layer 206(1) to provide for the first RDL substrate 202(1) to have multiple RDL metallization layers (block 308 in FIG. 3B). In this regard, as shown in FIG. 4D, the second RDL metallization layer 206(2) is formed by forming a second photosensitive non-polymer dielectric material layer 207(2) onto the first RDL metallization layer 206(1). For example, the second photosensitive non-polymer dielectric material layer 207(2) may be formed as a spun-on dielectric material on the first RDL metallization layer 206(1) as discussed above, and then cured. A photolithography process is used to pattern a second opening 404(2) in the second photosensitive non-polymer dielectric material layer 207(2) in which the second metal interconnect 208(2) will be formed for the first RDL substrate 202(1) (block 304 in FIG. 3A). The second opening 404(2) is formed to intersect the first metal line 410(1) in the first RDL metallization layer 206(1) in a fourth, vertical plane $P_4$ in the (Z-axis direction) so that a formed second metal interconnect 208(2) formed in the second opening 404(2) will be coupled to the first metal interconnect 208(1) in this example. The second metal interconnect 208(2) is formed in the second photosensitive non-polymer dielectric material layer 207(2) to form the second RDL metallization layer 206(2). In this example, the second metal interconnect 208(2) is formed by depositing a metal material (e.g., copper) in the second opening 404(2) such that the metal material fills the second opening 404(2) to form a second via 406(2).

Excess metal material is formed on a second, top surface 408(2) of the second photosensitive non-polymer dielectric material layer 207(2), which is then processed to form a second metal line 410(2) as part of the second metal interconnect 208(2). This structure redistributes the location of the second metal interconnect 208(2) from the second via 406(2) laterally in a horizontal direction (X- and/or Y-axis directions) in the second RDL metallization layer 206(2). The first metal line 410(1) has a first metal line portion 414(1) that intersects the fourth, vertical plane $P_4$ (in the Z-axis direction) also intersecting the second via 406(2) to be coupled to the second via 406(2). The second metal line 410(2) also has a second metal line portion 414(2) that intersects a fifth, vertical plane $P_5$ (in the Z-axis direction) that does not intersect the second via 406(2) so as to re-distribute the connection to the second via 406(2).

Figure 4E:
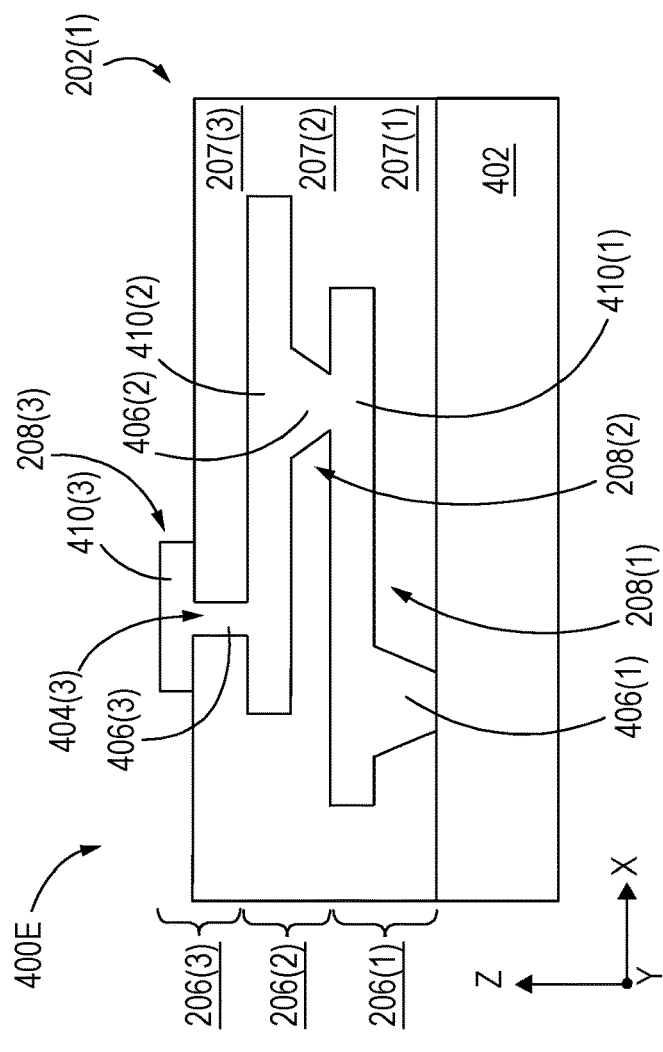

Then, as shown in the exemplary fabrication stage 400E in FIG. 4E, a next step in the fabrication process 300 can be to form a third RDL metallization layer 206(3) adjacent to the second RDL metallization layer 206(2) (block 310 in FIG. 3C). This provides for the first RDL substrate 202(1) to have an additional RDL metallization layer beyond the first and second RDL metallization layers 206(1), 206(2) to finalize fabrication of the first RDL substrate 202(1). The third RDL metallization layer 206(3) can be formed as discussed above for the first and second RDL metallization layers 206(1), 206(2). The third RDL metallization layer 206(3) is formed by forming a third photosensitive non-polymer dielectric material layer 207(3) onto the second RDL metallization layer 206(2). For example, the third photosensitive non-polymer dielectric material layer 207(3) may be formed as a spun-on dielectric material on the second RDL metallization layer 206(2) as discussed above, and then cured. A third metal interconnect 208(3) is formed in the third photosensitive non-polymer dielectric material layer 207(3) to form the third RDL metallization layer 206(3). In this example, the third metal interconnect 208(3) is formed by depositing a metal material (e.g., copper) in a patterned third opening 404(3) formed in the third photosensitive non-polymer dielectric material layer 207(3) such that the metal material fills the third opening 404(3) to form a third via 406(3) and third metal line 410(3). The carrier 402 can be removed leaving only the first RDL substrate 202(1).

FIGS. 5A-5C is a flowchart illustrating another, alternative exemplary fabrication process 500 of fabricating a hybrid RDL substrate having one or more RDL metallization layers that includes a photosensitive non-polymer dielectric material layers and photosensitive polymer dielectric material layers as the bottom and top dielectric material layers for increased package rigidity, wherein such RDL substrate can be the first and/or second RDL substrate 202(1), 202(2) in the IC package 200 in FIG. 2. The fabrication process 500 in FIG. 5 is discussed with regard to the first RDL substrate 202(1) in the IC package 200 in FIG. 2, but note that the fabrication process 500 in FIGS. 5A-5C is not limited to fabricating the first and/or second RDL substrate 202(1), 202(2) in FIG. 2. FIGS. 6A-6F are exemplary fabrication stages 600A-600F during fabrication of the first RDL substrate 202(1) according to the fabrication process 500 in FIGS. 5A-5C.

In this regard, as shown in the exemplary fabrication stage 600A in FIG. 6A, a first step in the fabrication process 500 is to provide the carrier 402, which may be a glass or silicon wafer or substrate for example (block 502 in FIG. 5A). Then, as shown in the exemplary fabrication stage 600B in FIG. 6B, a next step in the fabrication process 500 can be to form the first RDL metallization layer 206(1) by forming a first photosensitive non-polymer dielectric material layer 207(1) onto the carrier 402 that will serve as a part of a dielectric layer of a metallization layer of the first RDL substrate 202(1) (block 504 in FIG. 5A). The first photosensitive non-polymer dielectric material layer 207(1) is cured. For example, the first photosensitive non-polymer dielectric material layer 207(1) may be formed as a spun-on dielectric material on the carrier 402 and then cured. A photolithography process is used to pattern a first opening 604(1) in the first photosensitive non-polymer dielectric material layer 207(1) in which the first metal interconnect 208(1) will be formed for the first RDL substrate 202(1) (block 504 in FIG. 5A). Then, as shown in the exemplary fabrication stage 600C in FIG. 6C, a next step in the fabrication process 500 can be to form a first photosensitive polymer dielectric material layer 607(1) on the first photosensitive non-polymer dielectric material layer 207(1) to also serve as part of the dielectric layer of a first RDL metallization layer 206(1) of the first RDL substrate 202(1) (block 506 in FIG. 5A). A photolithography process is used to pattern a second opening 604(2) in the first photosensitive polymer dielectric material layer 607(1) that aligns with the first opening 604(1) in which a first metal interconnect 208(1) will be formed in the first RDL metallization layer 206(1) (block 506 in FIG. 5A). Forming the first RDL metallization layer 206(1) from a hybrid of the first photosensitive non-polymer dielectric material layer 207(1) and the first photosensitive polymer dielectric material layer 607(1) can allow the stiffness of the first RDL metallization layer 206(1) to be tuned depending on the thickness and other characteristics of the first photosensitive non-polymer dielectric material layer 207(1) and the first photosensitive polymer dielectric material layer 607(1).

Then, as shown in the exemplary fabrication stage 600D in FIG. 6D, a next step in the fabrication process 500 can be to form the first metal interconnect 208(1) in the first photosensitive non-polymer dielectric material layer 207(1) and the first photosensitive polymer dielectric material layer 607(1) to form the first RDL metallization layer 206(1) (block 508 in FIG. 5B). In this example, the first metal interconnect 208(1) is formed by depositing a metal material (e.g., copper) in the first openings 404(1), 604(1) such that the metal material fills the first openings 404(1), 604(1) to form the first via 406(1) (block 508 in FIG. 5B). Excess metal material is formed on a first, top surface 408(1) of the first photosensitive polymer dielectric material layer 607(1), which is then processed to form the first metal line 410(1) as part of the first metal interconnect 208(1) (block 508 in FIG. 5B). This structure redistributes the location of the first metal interconnect 208(1) from the first via 406(1) laterally in a horizontal direction (X- and/or Y-axis directions) in the first RDL metallization layer 206(1). Other details regarding the first metal interconnect 208(1) discussed above with regard to the fabrication process 300 in FIGS. 3A-3C can also be applicable in this example.

Then, as shown in the exemplary fabrication stage 600E in FIG. 6E, a next step in the fabrication process 500 can be to form the second RDL metallization layer 206(2) adjacent to the first RDL metallization layer 206(1) to provide for the first RDL substrate 202(1) to have multiple RDL metallization layers (block 510 in FIG. 5B). In this regard, as shown in FIG. 6E, the second RDL metallization layer 206(2) is formed by forming a second photosensitive polymer dielectric material layer 607(2) onto the first RDL metallization layer 206(1), and then curing same. A photolithography process is used to pattern the second opening 404(2) in the second photosensitive polymer dielectric material layer 607(2) in which the second metal interconnect 208(2) will be formed for the first RDL substrate 202(1) (block 510 in FIG. 5B). The second metal interconnect 208(2) is formed in the second photosensitive polymer dielectric material layer 607(2) to form the second RDL metallization layer 206(2). Other details regarding the second metal interconnect 208(2) discussed above with regard to the fabrication process 300 in FIGS. 3A-3C can also be applicable in this example.

Then, as shown in the exemplary fabrication stage 600F in FIG. 6F, a next step in the fabrication process 500 can be to form a third RDL metallization layer 206(3) adjacent to the second RDL metallization layer 206(2) (block 512 in FIG. 5C). This provides for the first RDL substrate 202(1) to have an additional RDL metallization layer beyond the first and second RDL metallization layers 206(1), 206(2) to finalize fabrication of the first RDL substrate 202(1). The third RDL metallization layer 206(3) can be formed as discussed above for the first and second RDL metallization layers 206(1), 206(2). The third RDL metallization layer 206(3) is formed by forming a third photosensitive polymer dielectric material layer 607(3) onto the second RDL metallization layer 206(2) and curing same, and then a second photosensitive non-polymer dielectric material layer 207(2) on the third photosensitive polymer dielectric material layer 607(3) and curing same. For example, the second photosensitive non-polymer dielectric material layer 207(2) may be formed as a spun-on dielectric material on the second RDL metallization layer 206(2) as discussed above, and then cured. Forming the third RDL metallization layer 206(3) from a hybrid of the second photosensitive non-polymer dielectric material layer 207(2) and the third photosensitive polymer dielectric material layer 607(3) can allow the stiffness of the first RDL metallization layer 206(1) to be tuned depending on the thickness and other characteristics of the second photosensitive non-polymer dielectric material layer 207(2) and the third photosensitive polymer dielectric material layer 607(3).

A third metal interconnect 208(3) is formed in the second photosensitive non-polymer dielectric material layer 207(2)

and third photosensitive polymer dielectric material layer 607(3) to form the third RDL metallization layer 206(3). In this example, the third metal interconnect 208(3) is formed by depositing a metal material (e.g., copper) in a patterned third opening 404(3) formed in the second photosensitive non-polymer dielectric material layer 207(2) and the third photosensitive polymer dielectric material layer 607(3) such that the metal material fills the third opening 404(3) to form a third via 406(3) and third metal line 410(3). The carrier 402 can be removed, leaving only the first RDL substrate 202(1).

Figure 7B:
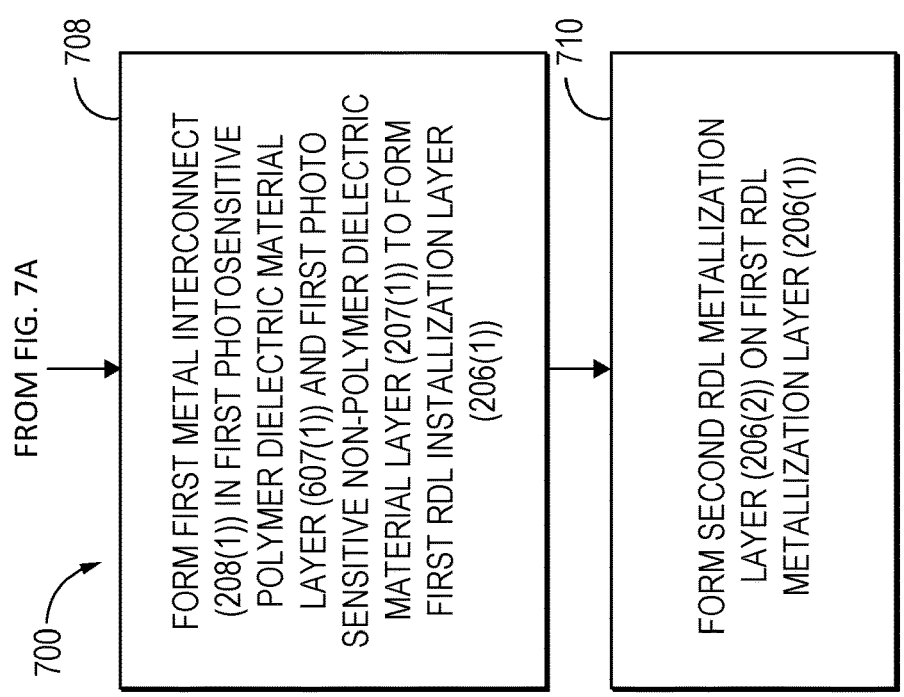

FIGS. 7A-7B is a flowchart illustrating another, alternative exemplary fabrication process 700 of fabricating a hybrid RDL substrate having one or more RDL metallization layers that include interleaved photosensitive non-polymer dielectric material layers and photosensitive polymer dielectric material layers for increased package rigidity, wherein such RDL substrate can be the first and/or second RDL substrate 202(1), 202(2) in the IC package 200 in FIG. 2. The fabrication process 700 in FIG. 7 is discussed with regard to the first RDL substrate 202(1) in the IC package 200 in FIG. 2, but note that the fabrication process 700 in FIGS. 7A-7B is not limited to fabricating the first and/or second RDL substrate 202(1), 202(2) in FIG. 2. FIGS. 8A-8E are exemplary fabrication stages 800A-800E during fabrication of the first RDL substrate 202(1) according to the fabrication process 700 in FIGS. 7A-7B.

In this regard, as shown in the exemplary fabrication stage 800A in FIG. 8A, a first step in the fabrication process 700 is to provide the carrier 402, which may be a glass or silicon wafer or substrate, for example (block 702 in FIG. 7A). Then, as also shown in the exemplary fabrication stage 800A in FIG. 8A, a next step in the fabrication process 500 can be to form the first RDL metallization layer 206(1) by forming a first photosensitive polymer dielectric material layer 607(1) onto the carrier 402 that will serve as a part of a dielectric layer of a metallization layer of the first RDL substrate 202(1) and curing same (block 702 in FIG. 7A). Then, as shown in the exemplary fabrication stage 800B in FIG. 8B, a next step in the fabrication process 700 can be to form the first photosensitive non-polymer dielectric material layer 207(1) on the first photosensitive polymer dielectric material layer 607(1) and curing same (block 704 in FIG. 7A). Then, as shown in the exemplary fabrication stages 800B and 800C, next steps of the fabrication process 700 can be to pattern the first openings 404(1), 604(1) in the respective first photosensitive polymer dielectric material layer 607(1) and the first photosensitive non-polymer dielectric material layer 207(1) (blocks 704 and 706 in FIG. 7A). A photolithography process can be used to pattern the first openings 404(1), 604(1) in which the first metal interconnect 208(1) will be formed for the first RDL substrate 202(1).

Figure 8D:
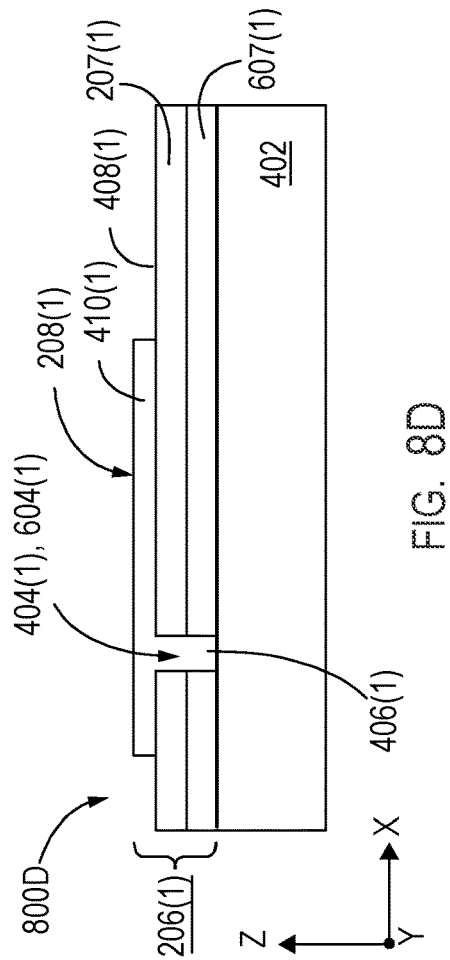

Then, as shown in the exemplary fabrication stage 800D in FIG. 8D, a next step in the fabrication process 700 can be to form the first metal interconnect 208(1) in the first photosensitive polymer dielectric material layer 607(1) and the first photosensitive non-polymer dielectric material layer 207(1) to form the first RDL metallization layer 206(1) (block 708 in FIG. 7B). In this example, the first metal interconnect 208(1) is formed by depositing a metal material (e.g., copper) in the first openings 404(1), 604(1) such that the metal material fills the first openings 404(1), 604(1) to form the first via 406(1). Excess metal material is formed on a first, top surface 408(1) of the first photosensitive non-polymer dielectric material layer 207(1), which is then processed to form the first metal line 410(1) as part of the first metal interconnect 208(1). This structure redistributes the location of the first metal interconnect 208(1) from the first via 406(1) laterally in a horizontal direction (X- and/or Y-axis directions) in the first RDL metallization layer 206 (1). Other details regarding the first metal interconnect 208(1) discussed above with regard to the fabrication process 300 in FIGS. 3A-3C can also be applicable in this example.

Figure 8E:
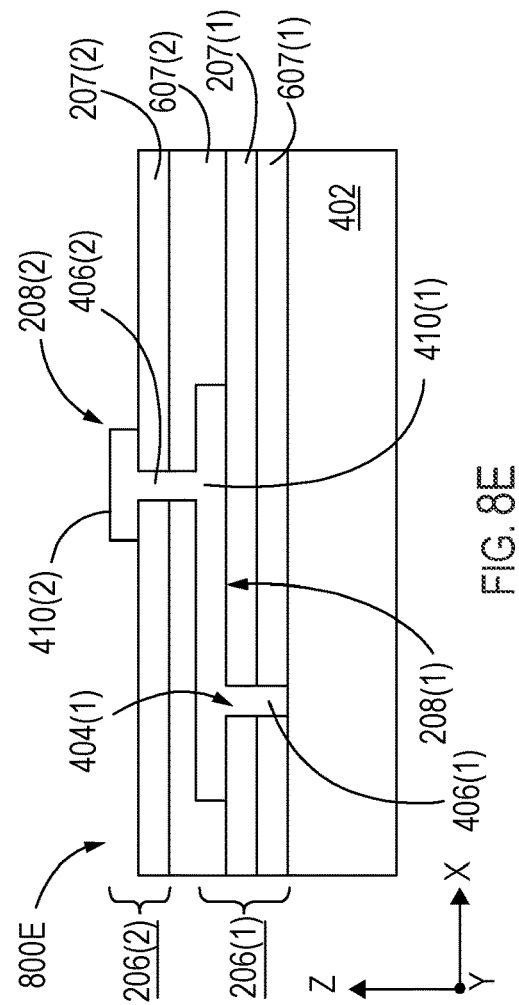

Then, as shown in the exemplary fabrication stage 800E in FIG. 8E, a next step in the fabrication process 700 can be to form the second RDL metallization layer 206(2) adjacent to the first RDL metallization layer 206(1) to provide for the first RDL substrate 202(1) to have multiple RDL metallization layers (block 710 in FIG. 7B). In this regard, as shown in FIG. 8E, the second RDL metallization layer 206(2) is formed by depositing a second photosensitive polymer dielectric material layer 607(2) onto the first RDL metallization layer 206(1) and curing same. A second photosensitive non-polymer dielectric material layer 207(2) is formed on the second photosensitive polymer dielectric material layer 607(2) and then cured. For example, the second photosensitive non-polymer dielectric material layer 207(2) may be formed as a spun-on dielectric material as discussed above, and then cured. A photolithography process is used to pattern the second opening 404(2) in the second photosensitive polymer dielectric material layer 607(2) and the second photosensitive non-polymer dielectric material layer 207(2) in which the second metal interconnect 208(2) will be formed for the first RDL substrate 202(1). The second metal interconnect 208(2) is formed in the second photosensitive polymer dielectric material layer 607(2) and the second photosensitive non-polymer dielectric material layer 207(2) to form the second RDL metallization layer 206(2). Other details regarding the second metal interconnect 208(2) discussed above with regard to the fabrication process 300 in FIGS. 3A-3C can also be applicable in this example. The carrier 402 can be removed leaving only the first RDL substrate 202(1).

FIGS. 9A-9B is a flowchart illustrating another, alternative exemplary fabrication process 900 of fabricating a hybrid RDL substrate having one or more RDL metallization layers that include interleaved photosensitive non-polymer dielectric material layers and photosensitive polymer dielectric material layers for increased package rigidity, wherein such RDL substrate can be the first and/or second RDL substrate 202(1), 202(2) in the IC package 200 in FIG. 2. The fabrication process 900 in FIGS. 9A-9B is similar to the fabrication process 700 in FIGS. 7A-7B. The fabrication process 900 in FIGS. 9A-9B is discussed with regard to the first RDL substrate 202(1) in the IC package 200 in FIG. 2, but note that the fabrication process 900 in FIGS. 9A-9B is not limited to fabricating the first and/or second RDL substrate 202(1), 202(2) in FIG. 2. FIGS. 10A-10D are exemplary fabrication stages 1000A-1000E during fabrication of the first RDL substrate 202(1) according to the fabrication process 900 in FIGS. 9A-9B.

In this regard, as shown in the exemplary fabrication stage 1000A in FIG. 8A, a first step in the fabrication process 900 is to provide the carrier 402, which may be a glass or silicon wafer or substrate for example (block 902 in FIG. 9A). Then, as also shown in the exemplary fabrication stage 900A in FIG. 9A, a next step in the fabrication process 900 can be to form the first RDL metallization layer 206(1) by forming a first photosensitive polymer dielectric material layer 607(1) onto the carrier 402 that will serve as a part of a dielectric layer of a metallization layer of the first RDL substrate 202(1) and curing same (block 902 in FIG. 9A). The first opening 404(1) is patterned in the first photosensitive polymer dielectric material layer 607(1) to receive a metal material to form the first metal interconnect 208(1). A photolithography process can be used to pattern the first opening 404(1) in which the first metal interconnect 208(1) will be formed for the first RDL substrate 202(1). Then, as shown in the exemplary fabrication stage 1000B in FIG. 10B, a next step in the fabrication process 900 can be to form the first photosensitive non-polymer dielectric material layer 207(1) on the first photosensitive polymer dielectric material layer 607(1) and curing same (block 904 in FIG. 9A). In the fabrication process 900 in FIG. 9A, unlike the fabrication process 700 in FIGS. 7A-7B, the first opening 404(1) is patterned in the first photosensitive polymer dielectric material layer 607(1) before the first photosensitive non-polymer dielectric material layer 207(1) is formed. Then, as also shown in the exemplary fabrication stage 1000B, the first opening 604(1) is patterned in the respective first photosensitive non-polymer dielectric material layer 207(1) (block 904 in FIG. 9A). A photolithography process can be used to pattern the first opening 604(1) in which the first metal interconnect 208(1) will be formed for the first RDL substrate 202(1).

Then, as shown in the exemplary fabrication stage 1000C in FIG. 10C, a next step in the fabrication process 900 can be to form the first metal interconnect 208(1) in the first photosensitive polymer dielectric material layer 607(1) and the first photosensitive non-polymer dielectric material layer 207(1) to form the first RDL metallization layer 206(1) (block 906 in FIG. 9B). In this example, the first metal interconnect 208(1) is formed by depositing a metal material (e.g., copper) in the first openings 404(1), 604(1) such that the metal material fills the first openings 404(1), 604(1) to form the first via 406(1). Excess metal material is formed on a first, top surface 408(1) of the first photosensitive non-polymer dielectric material layer 207(1), which is then processed to form the first metal line 410(1) as part of the first metal interconnect 208(1). This structure redistributes the location of the first metal interconnect 208(1) from the first via 406(1) laterally in a horizontal direction (X- and/or Y-axis directions) in the first RDL metallization layer 206 (1). Other details regarding the first metal interconnect 208(1) discussed above with regard to the fabrication process 700 in FIGS. 7A-7B can also be applicable in this example.

Then, as shown in the exemplary fabrication stage 1000D in FIG. 10D, a next step in the fabrication process 900 can be to form the second RDL metallization layer 206(2) adjacent to the first RDL metallization layer 206(1) to provide for the first RDL substrate 202(1) to have multiple RDL metallization layers (block 908 in FIG. 9B). In this regard, as shown in FIG. 10D, the second RDL metallization layer 206(2) is formed by depositing a second photosensitive polymer dielectric material layer 607(2) onto the first RDL metallization layer 206(1) and curing same. A second photosensitive non-polymer dielectric material layer 207(2) is formed on the second photosensitive polymer dielectric material layer 607(2) and then cured. For example, the second photosensitive non-polymer dielectric material layer 207(2) may be formed as a spun-on dielectric material on the first RDL metallization layer 206(1) as discussed above, and then cured. A photolithography process is used to pattern the second opening 404(2) in the second photosensitive polymer dielectric material layer 607(2) and the second photosensitive non-polymer dielectric material layer 207(2) in which the second metal interconnect 208(2) will be formed for the first RDL substrate 202(1). The second metal interconnect 208(2) is formed in the second photosensitive polymer dielectric material layer 607(2) and the second photosensitive non-polymer dielectric material layer 207(2) to form the second RDL metallization layer 206(2). Other details regarding the second metal interconnect 208(2) discussed above with regard to the fabrication process 700 in FIG. 7A-7B can also be applicable in this example. The carrier 402 can be removed leaving only the first RDL substrate 202(1).

FIGS. 11A-11C is a flowchart illustrating an exemplary process of fabricating an IC package that includes a RDL substrate having one or more RDL metallization layers that include a photosensitive non-polymer dielectric material layer for increased package rigidity, wherein the RDL substrate can be, but is not limited to, the first and second RDL substrates 202(1), 202(2) in FIGS. 4E, 6F, 8E, and 10D, wherein the IC package can be, but is not limited to, the IC package 200 in FIG. 2. The fabrication process 1100 in FIGS. 11A-11C is discussed with regard to the IC package 200 in FIG. 2, but note that the fabrication process 1100 in FIGS. 11A-11C is not limited to fabricating the IC package 200 in FIG. 2. FIGS. 12A-12F are exemplary fabrication stages 1200A-1200F during fabrication of an IC package according to the exemplary fabrication process in FIGS. 11A-11C.

In this regard, as shown in the exemplary fabrication stage 1200A in FIG. 12A, a first step in the fabrication process 1100 to fabricate the IC package 200 can be to fabricate the first RDL substrate 202(1) on the carrier 402 (block 1102 in FIG. 11). The first RDL substrate 202(1) can be formed on the carrier 402 according to any of the previous RDL substrate fabrication methods discussed above as examples. As also shown in the fabrication stage 1200A in FIG. 12A, first metal interconnects 1210(1) and metal posts 222 are formed in contact with first metal interconnects 208(1) in the first RDL metallization layer 206(1) of the first RDL substrate 202(1) (block 1102 in FIG. 11). This is to prepare the first die 204(1) to be placed in physical and electrical contact with the first RDL substrate 202(1).

In this regard, as shown in the exemplary fabrication stage 1200B in FIG. 12B, a next step of the fabrication process 1100 can include the first die 204(1), and its die interconnects 210, being coupled to the first metal interconnects 1210(1) coupled to first metal interconnects 208(1) in the first RDL metallization layer 206(1) to couple the first die 204(1) to the first RDL substrate 202(1) (block 1104 in FIG. 11A). Then, as shown in the exemplary fabrication stage 1200C in FIG. 12C, a next step in the fabrication process 1100 can include disposing a molding compound 1202 around the first die 204(1) and the metal posts 222 to form the first die package 214(1) that includes the first die 204(1) and coupled to the first RDL substrate 202(1) (block 1106 in FIG. 11B). Then, as shown in the exemplary fabrication stage 1200D in FIG. 12D, a next step of the fabrication process 1100 can include forming the second RDL substrate 202(2) on the first die package 214(1) wherein certain metal interconnects 220 in the RDL metallization layer 218 are coupled to the metal posts 222 (block 1208 in FIG. 11B). Second metal interconnects 1210(2) are also formed on the second RDL substrate 202(2) to provide for the ability of a second die 204(2) (see FIG. 2) to be coupled to the second RDL substrate 202(2). The second RDL substrate 202(2) can be fabricated according to any of the previously discussed fabrication processes for fabricating a RDL substrate.

Then, as shown in the exemplary fabrication stage 1200E in FIG. 12E, a next step of the fabrication process 1100 can include removing the carrier 402 (block 1110 in FIG. 11C). Then, as shown in the exemplary fabrication stage 1200F in FIG. 12F, a next step of the fabrication process 1100 can include forming the external interconnects 216 in contact with the second metal interconnects 208(2) of the second RDL metallization layer 206(2) of the first RDL substrate 202(1) to complete the fabrication of the IC package 200 (block 1212 in FIG. 11C).

Figure 13:
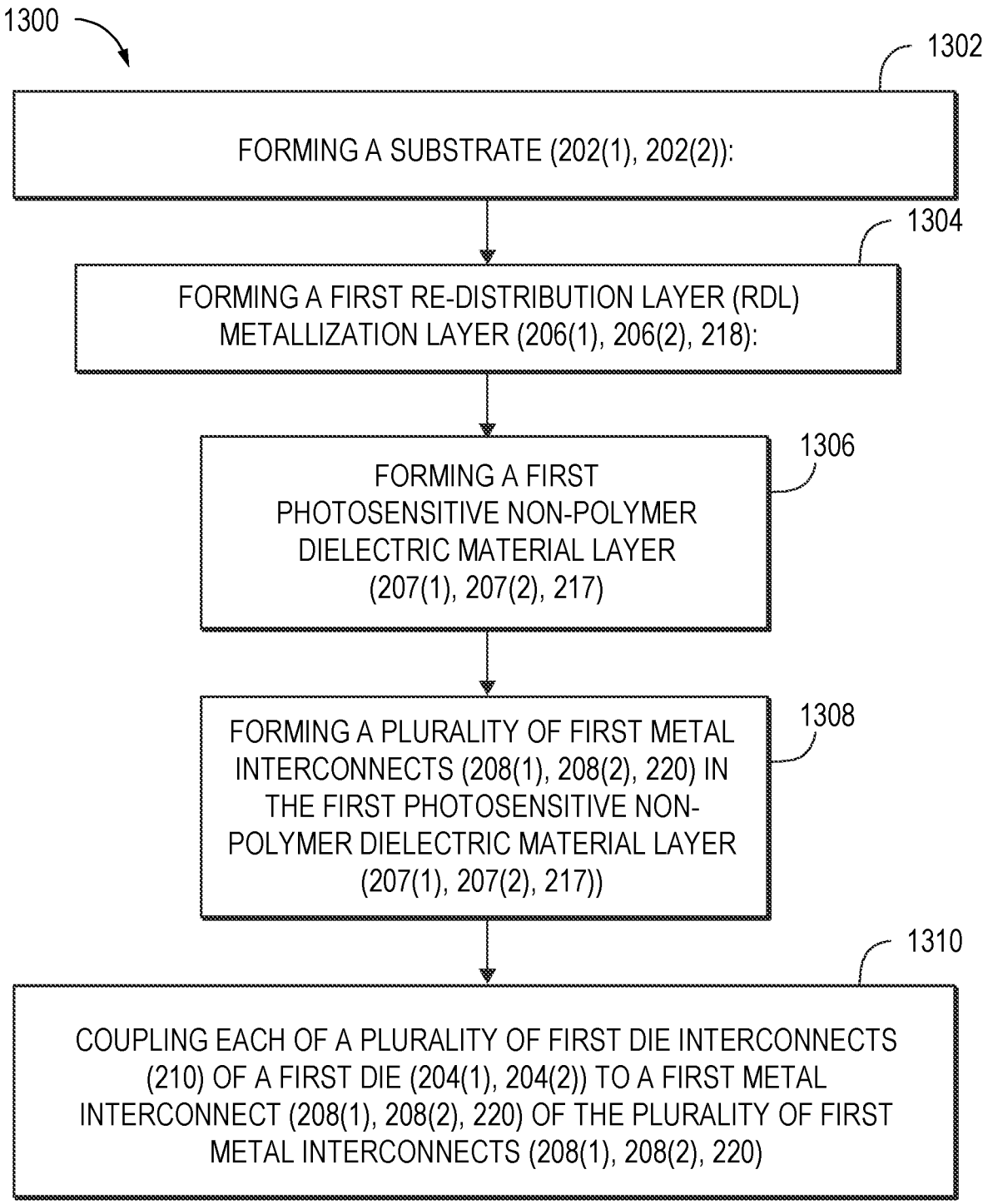
FIG. 13 is a flowchart illustrating another exemplary fabrication process for fabricating an IC package that includes one or more RDL substrates each having one or more RDL metallization layers that include a photosensitive non-polymer dielectric material layer for increased package rigidity, wherein such RDL substrate can be the RDL substrate in the IC package in FIG. 2.

FIG. 13 is a flowchart illustrating another exemplary fabrication process 1300 of fabricating an IC package that includes one or more RDL substrates each having one or more RDL metallization layers that include a photosensitive non-polymer dielectric material layer for increased package rigidity, wherein such RDL substrate can be the first and/or second RDL substrates 202(1), 202(2) in the IC package 200 in FIG. 2.

In this regard, a first step in the fabrication process 1300 can be to form a substrate, which can be the first and second RDL substrates 202(1), 202(2) in the IC package 200 in FIG. 2 (block 1302 in FIG. 13). Forming the first RDL substrate 202(1), 202(2) can involve steps of forming a first RDL metallization layer 206(1), 206(2), 218 (block 1304 in FIG. 13), which can include forming the first photosensitive non-polymer dielectric material layer 207(1), 207(2), 217 (block 1306 in FIG. 13), and forming a plurality of first metal interconnects 208(1), 208(2), 220 in the first photosensitive non-polymer dielectric material layer 207(1), 207(2), 217 (block 1308 in FIG. 13). A next step in the fabrication process 1300 can include coupling each of a plurality of first die interconnects 210 of a first die 204(1), 204(2) to a first metal interconnect 208(1), 208(2), 220 of the plurality of first metal interconnects 208(1), 208(2), 220 (block 1310 in FIG. 13).

Electronic devices that include an IC package that includes a RDL substrate having one or more RDL metallization layers that include a photosensitive non-polymer dielectric material layer for increased package rigidity, including but not limited to the IC packages 200 and the first and second RDL substrates 202(1), 202(2) in FIGS. 2, 4A-4E, 6A-6F, 8A-8E, 10A-10D, and 12A-12F and according to, but not limited to, any of the exemplary fabrication processes 300, 500, 700, 900, 1100 in FIGS. 3A-3C, 5A-5C, 7A-7B, 9A-9B, 11A-11C, and 13, and according to any aspects disclosed herein, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, laptop computer, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, an avionics system, a drone, and a multicopter.

Figure 14:
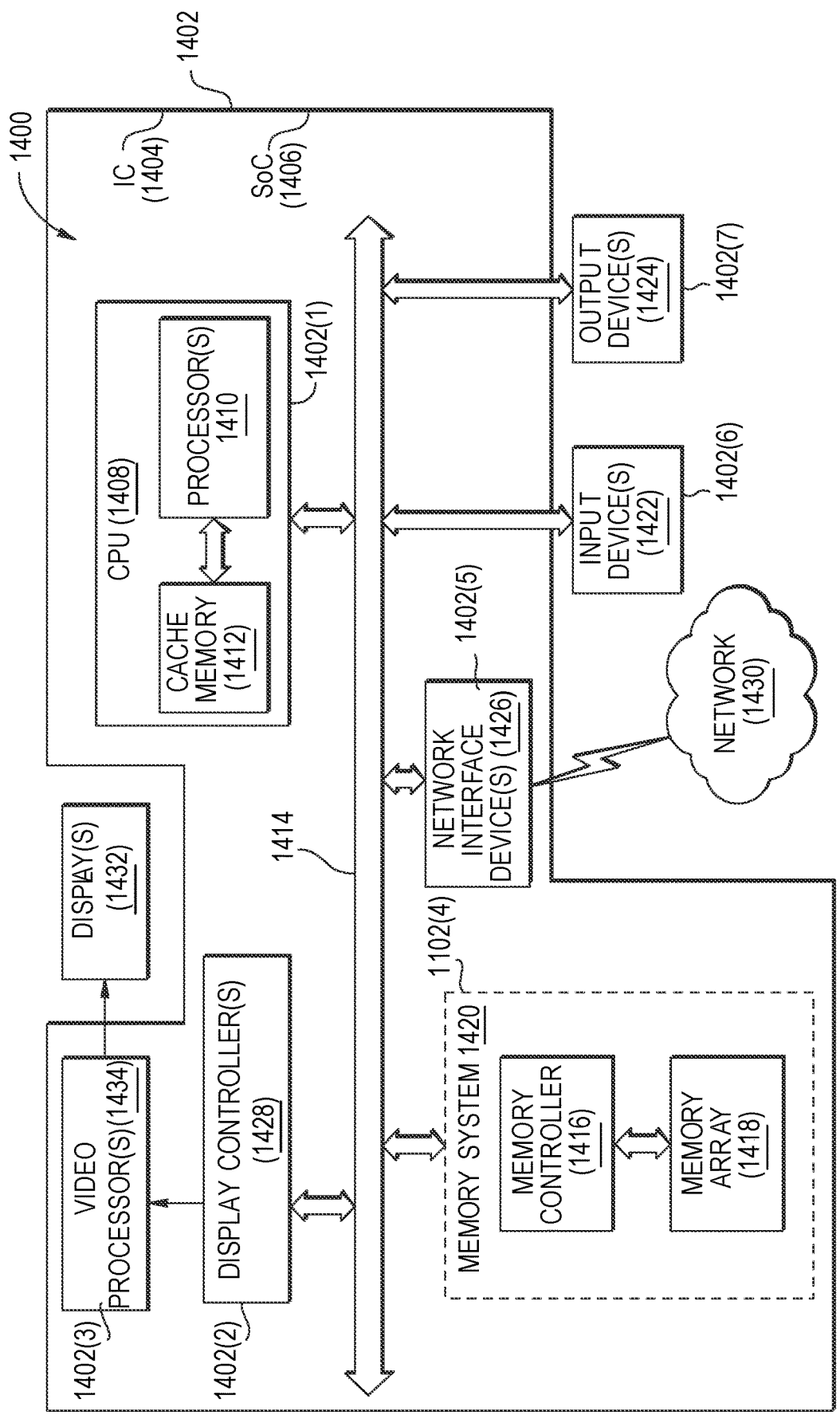
FIG. 14 is a block diagram of an exemplary processor-based system that can include an IC package that includes a RDL substrate having one or more RDL metallization layers that include a photosensitive non-polymer dielectric material layer for increased package rigidity including, but not limited to, the IC packages in FIGS. 2 and 12D, and wherein the package substrate can include, but is not limited to, a RDL substrate like the RDL substrates in FIGS. 2, 4A-4E, 6A-6F, 8A-8E, 10A-10D, and 12A-12F, and that can be fabricated according to any of the fabrication processes in FIGS. 3A-3C, 5A-5C, 7A-7B, 9A-9B, 11A-11C, and 13.

In this regard, FIG. 14 illustrates an example of a processor-based system 1400 that can include an IC package 1402 that includes a RDL substrate having one or more RDL metallization layers that include a photosensitive non-polymer dielectric material layer for increased package rigidity, including but not limited to the IC packages 200 and first and second RDL substrates 202(1), 202(2) in FIGS. 2, 4A-4E, 6A-6F, 8A-8E, 10A-10D, and 12A-12F and according to, but not limited to, any of the exemplary fabrication processes 300, 500, 700, 900, 1100 in FIGS. 3A-3C, 5A-5C, 7A-7B, 9A-9B, 11A-11C, and 13, and according to any aspects disclosed herein. In this example, the processor-based system 1200 may be formed as an IC 1404 in the IC package 1402 and as a system-on-a-chip (SoC) 1406. The processor-based system 1400 includes a central processing unit (CPU) 1408 that includes one or more processors 1410, which may also be referred to as CPU cores or processor cores. The CPU 1408 may have cache memory 1412 coupled to the CPU 1408 for rapid access to temporarily stored data. The CPU 1408 is coupled to a system bus 1414 and can intercouple master and slave devices included in the processor-based system 1400. As is well known, the CPU 1408 communicates with these other devices by exchanging address, control, and data information over the system bus 1414. For example, the CPU 1408 can communicate bus transaction requests to a memory controller 1416, as an example of a slave device. Although not illustrated in FIG. 14, multiple system buses 1414 could be provided, wherein each system bus 1414 constitutes a different fabric.

Other master and slave devices can be connected to the system bus 1414. As illustrated in FIG. 14, these devices can include a memory system 1420 that includes the memory controller 1416 and a memory array(s) 1418, one or more input devices 1422, one or more output devices 1424, one or more network interface devices 1426, and one or more display controllers 1428, as examples. Each of the memory system(s) 1420, the one or more input devices 1422, the one or more output devices 1424, the one or more network interface devices 1426, and the one or more display controllers 1428 can be provided in the same or different IC packages 1402(2)-1402(7). The input device(s) 1422 can include any type of input device, including, but not limited to, input keys, switches, voice processors, etc. The output device(s) 1424 can include any type of output device, including, but not limited to, audio, video, other visual indicators, etc. The network interface device(s) 1426 can be any device configured to allow exchange of data to and from a network 1430. The network 1430 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1426 can be configured to support any type of communications protocol desired.

The CPU 1408 may also be configured to access the display controller(s) 1428 over the system bus 1414 to control information sent to one or more displays 1432. The display controller(s) 1428 sends information to the display(s) 1432 to be displayed via one or more video processor(s) 1434, which process the information to be displayed into a format suitable for the display(s) 1432. The display controller(s) 1428 and video processor(s) 1434 can be included as ICs in the same or different IC packages 1402(2), 1402(3), and in the same or different IC packages 1402 containing the CPU 1408, as an example. The display(s) 1432 can include any type of display, including, but not limited to, a cathode ray tube (CRT), a liquid crystal display (LCD), a plasma display, a light emitting diode (LED) display, etc.

Figure 15:
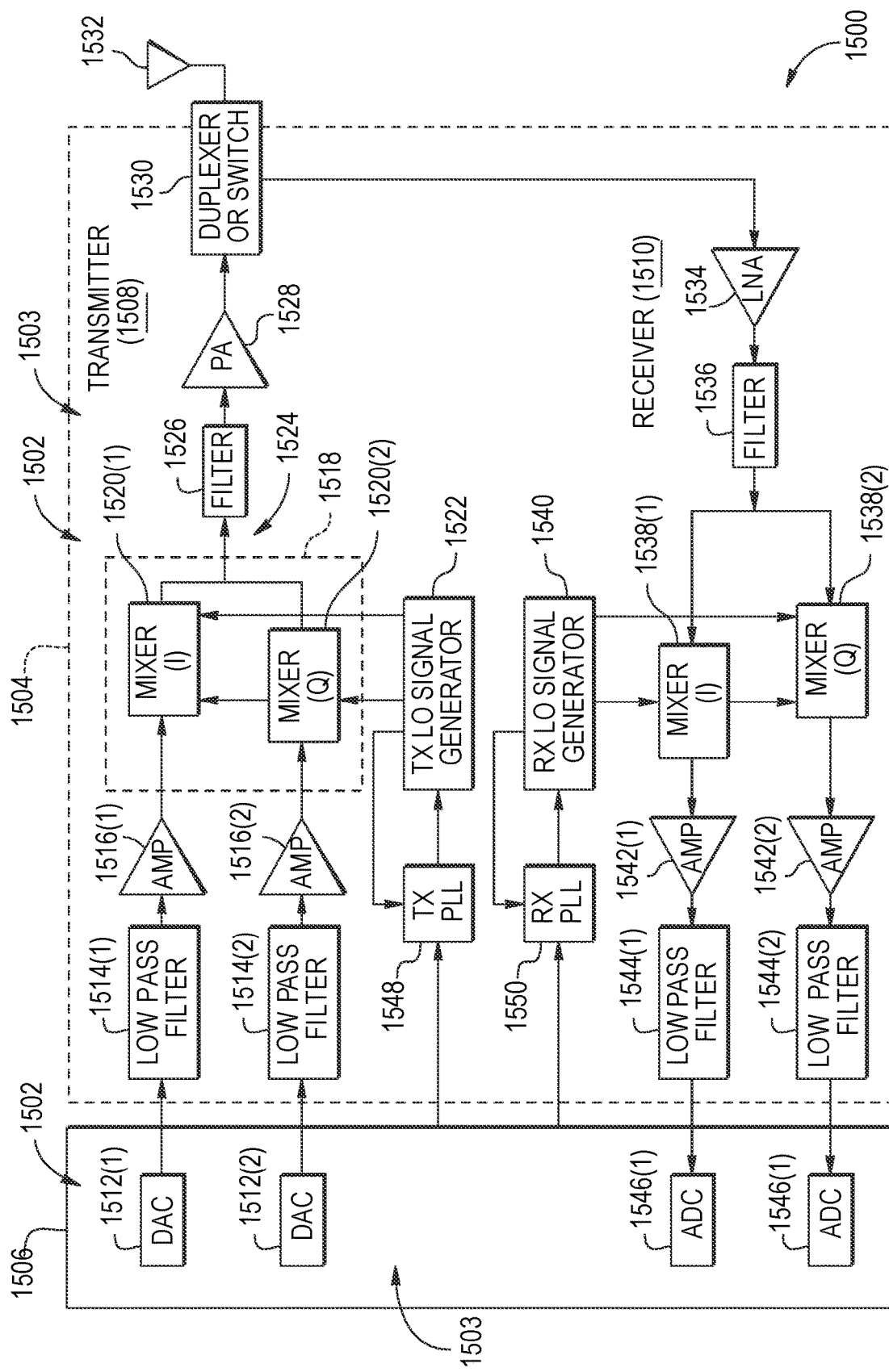
FIG. 15 is a block diagram of an exemplary wireless communication device that includes radio-frequency (RF) components that can include an IC package that includes a RDL substrate having one or more RDL metallization layers that include a photosensitive non-polymer dielectric material layer for increased package rigidity including, but not limited to, the IC packages in FIGS. 2 and 12D, and wherein the package substrate can include, but is not limited to, a RDL substrate like the RDL substrates in FIGS. 2, 4A-4E, 6A-6F, 8A-8E, 10A-10D, and 12A-12F, and that can be fabricated according to any of the fabrication processes in FIGS. 3A-3C, 5A-5C, 7A-7B, 9A-9B, 11A-11C, and 13.

FIG. 15 illustrates an exemplary wireless communications device 1500 that includes radio-frequency (RF) components formed from one or more ICs 1502, wherein any of the ICs 1502 can be included an IC package 1503. The IC package 1503 can include a RDL substrate having one or more RDL metallization layers that include a photosensitive non-polymer dielectric material layer for increased package rigidity, including but not limited to the IC packages 200 and first and second RDL substrates 202(1), 202(2) in FIGS. 2, 4A-4E, 6A-6F, 8A-8E, 10A-10D, and 12A-12F, and according to, but not limited to, any of the exemplary fabrication processes 300, 500, 700, 900, 1100 in FIGS. 3A-3C, 5A-5C, 7A-7B, 9A-9B, 11A-11C, and 13, and according to any aspects disclosed herein. The wireless communications device 1500 may include or be provided in any of the above-referenced devices, as examples. As shown in FIG. 15, the wireless communications device 1500 includes a transceiver 1504 and a data processor 1506. The data processor 1506 may include a memory to store data and program codes. The transceiver 1504 includes a transmitter 1508 and a receiver 1510 that support bi-directional communications. In general, the wireless communications device 1500 may include any number of transmitters 1508 and/or receivers 1510 for any number of communication systems and frequency bands. All or a portion of the transceiver 1504 may be implemented on one or more analog ICs, RF ICs (RFICs), mixed-signal ICs, etc.

The transmitter 1508 or the receiver 1510 may be implemented with a super-heterodyne architecture or a direct-conversion architecture. In the super-heterodyne architecture, a signal is frequency-converted between RF and baseband in multiple stages, for example, from RF to an intermediate frequency (IF) in one stage, and then from IF to baseband in another stage for the receiver 1510. In the direct-conversion architecture, a signal is frequency-converted between RF and baseband in one stage. The super-heterodyne and direct-conversion architectures may use different circuit blocks and/or have different requirements. In the wireless communications device 1500 in Figure Y, the transmitter 1508 and the receiver 1510 are implemented with the direct-conversion architecture.

In the transmit path, the data processor 1506 processes data to be transmitted and provides I and Q analog output signals to the transmitter 1508. In the exemplary wireless communications device 1500, the data processor 1506 includes digital-to-analog converters (DACs) 1512(1), 1512(2) for converting digital signals generated by the data processor 1506 into the I and Q analog output signals (e.g., I and Q output currents) for further processing.

Within the transmitter 1508, lowpass filters 1514(1), 1514(2) filter the I and Q analog output signals, respectively, to remove undesired signals caused by the prior digital-to-analog conversion. Amplifiers (AMPs) 1516(1), 1516(2) amplify the signals from the lowpass filters 1514(1), 1514(2), respectively, and provide I and Q baseband signals. An upconverter 1518 upconverts the I and Q baseband signals with I and Q transmit (TX) local oscillator (LO) signals through mixers 1520(1), 1520(2) from a TX LO signal generator 1522 to provide an upconverted signal 1524. A filter 1526 filters the upconverted signal 1524 to remove undesired signals caused by the frequency up-conversion as well as noise in a receive frequency band. A power amplifier (PA) 1528 amplifies the upconverted signal 1524 from the filter 1526 to obtain the desired output power level and provides a transmit RF signal. The transmit RF signal is routed through a duplexer or switch 1530 and transmitted via an antenna 1532.

In the receive path, the antenna 1532 receives signals transmitted by base stations and provides a received RF signal, which is routed through the duplexer or switch 1530 and provided to a low noise amplifier (LNA) 1534. The duplexer or switch 1530 is designed to operate with a specific receive (RX)-to-TX duplexer frequency separation, such that RX signals are isolated from TX signals. The received RF signal is amplified by the LNA 1534 and filtered by a filter 1536 to obtain a desired RF input signal. Down-conversion mixers 1538(1), 1538(2) mix the output of the filter 1536 with I and Q RX LO signals (i.e., LO_I and LO_Q) from an RX LO signal generator 1540 to generate I and Q baseband signals 1538(1), 1538(2). The I and Q baseband signals are amplified by AMPs 1542(1), 1542(2) and further filtered by lowpass filters 1544(1), 1544(2) to obtain I and Q analog input signals, which are provided to the data processor 1506. In this example, the data processor 1506 includes analog-to-digital converters (ADCs) 1546(1), 1546(2) for converting the analog input signals into digital signals to be further processed by the data processor 1506.

In the wireless communications device 1500 of FIG. 15, the TX LO signal generator 1522 generates the I and Q TX LO signals used for frequency up-conversion, while the RX LO signal generator 1540 generates the I and Q RX LO signals used for frequency down-conversion. Each LO signal is a periodic signal with a particular fundamental frequency. A TX phase-locked loop (PLL) circuit 1548 receives timing information from the data processor 1506 and generates a control signal used to adjust the frequency and/or phase of the TX LO signals from the TX LO signal generator 1522. Similarly, an RX PLL circuit 1550 receives timing information from the data processor 1506 and generates a control signal used to adjust the frequency and/or phase of the RX LO signals from the RX LO signal generator 1540.

Those of skill in the art will further appreciate that the various illustrative logical blocks, modules, circuits, and algorithms described in connection with the aspects disclosed herein may be implemented as electronic hardware, instructions stored in memory or in another computer readable medium wherein any such instructions are executed by a processor or other processing device, or combinations of both. The devices and components described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein, but is to be accorded the widest scope consistent with the principles and novel features disclosed herein.

Implementation examples are described in the following numbered clauses:

1. An integrated circuit (IC) package, comprising:
    a first substrate, comprising:
        a first re-distribution layer (RDL) metallization layer, comprising:
            a first photosensitive non-polymer dielectric material layer; and
            a plurality of first metal interconnects disposed in the first photosensitive non-polymer dielectric material layer; and
        a first die comprising a plurality of first die interconnects each coupled to a first metal interconnect of the plurality of first metal interconnects.
2. The IC package of clause 1, wherein the first photosensitive non-polymer dielectric material layer comprises a spin-on photosensitive non-polymer dielectric material.
3. The IC package of clause 1, wherein the first photosensitive non-polymer dielectric material layer comprises a first photosensitive non-polymer dielectric film.
4. The IC package of any of clauses 1-3, wherein the first photosensitive non-polymer dielectric material layer comprises an inorganic material.
5. The IC package of any of clauses 1-4, wherein the first photosensitive non-polymer dielectric material layer comprises a material comprised from the group consisting of a Silicon Oxide (SiOx) and a Silicon Nitride (SiN).
6. The IC package of any of clauses 1-5, wherein the first photosensitive non-polymer dielectric material layer has an elastic modulus between 63 and 77 GigaPascals (GPa).
7. The IC package of any of clauses 1-6, wherein the first photosensitive non-polymer dielectric material layer has a coefficient of thermal expansion (CTE) less than one (1) parts per million (ppm) per degree Celsius (C) (ppm/° C.).
8. The IC package of any of clauses 1-7, wherein the first photosensitive non-polymer dielectric material layer has a thermal stability up to 900 degrees Celsius (° C.).
9. The IC package of any of clauses 1-8, wherein:
    the first RDL metallization layer further comprises a first photosensitive polymer dielectric material layer adjacent to the first photosensitive non-polymer dielectric material layer; and
    the plurality of first metal interconnects disposed in the first photosensitive non-polymer dielectric material layer and the first photosensitive polymer dielectric material layer.
10. The IC package of clause 9, wherein:
    the first substrate further comprises a second RDL metallization layer adjacent to the first RDL metallization layer, the second RDL metallization layer comprising:
        a second photosensitive non-polymer dielectric material layer;
        a second photosensitive polymer dielectric material layer adjacent to the second photosensitive non-polymer dielectric material layer; and
        a plurality of second metal interconnects disposed in the second photosensitive non-polymer dielectric material layer and the second photosensitive polymer dielectric material layer.
11. The IC package of clause 10, wherein the first photosensitive polymer dielectric material layer is adjacent to the second photosensitive polymer dielectric material layer.
12. The IC package of clause 10, wherein the first photosensitive non-polymer dielectric material layer is adjacent to the first photosensitive polymer dielectric material layer.
13. The IC package of any of clauses 1-12, wherein:
    the first RDL metallization layer extends in a first plane in a first direction;
    each of the plurality of first metal interconnects comprises:
        a first via extending in a second plane orthogonal to the first plane; and
        a first metal line coupled to the first via, the first metal line comprising a first metal line portion intersecting the second plane and a second metal line portion not intersecting the second plane.
14. The IC package of any of clauses 1-13, wherein the first substrate further comprises a first surface and a second surface opposing the first surface; and
    the first RDL metallization layer disposed between the first surface and the second surface.
15. The IC package of any of clauses 1-14, comprising a package-on-package IC package, comprising:

a first die package comprising the first substrate and the first die; and
a second die package, comprising:
   a second substrate, comprising:
      a second RDL metallization layer, comprising:
         a second photosensitive non-polymer dielectric material layer; and
         a plurality of second metal interconnects disposed in the second photosensitive non-polymer dielectric material layer; and
   a second die comprising a plurality of second die interconnects each coupled to a second metal interconnect of the plurality of second metal interconnects;
wherein:
   the first die package is coupled to the second die package; and
   at least one second metal interconnect of the plurality of second metal interconnects is coupled to at least one first metal interconnect of the plurality of first metal interconnects.

16. The IC package of any of clauses 1-15 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

17. A method of fabricating an integrated circuit (IC) package, comprising:
   forming a first substrate, comprising:
      forming a first re-distribution layer (RDL) metallization layer, comprising:
         forming a first photosensitive non-polymer dielectric material layer; and
         forming a plurality of first metal interconnects in the first photosensitive non-polymer dielectric material layer; and
   coupling each of a plurality of first die interconnects of a first die to a first metal interconnect of the plurality of first metal interconnects.

18. The method of clause 17, wherein forming the first substrate further comprises spinning on the first photosensitive non-polymer dielectric material layer on a carrier.

19. The method of clause 17 or 18, wherein forming the plurality of first metal interconnects in the first photosensitive non-polymer dielectric material layer comprises:
   forming a plurality of first openings in the first photosensitive non-polymer dielectric material layer;
   disposing a metal material in the plurality of first openings to form a plurality of first vias in the plurality of first openings; and
   forming a plurality of metal lines adjacent to the first photosensitive non-polymer dielectric material layer each coupled to a first via of the plurality of first vias.

20. The method of any of clauses 17-19, wherein forming the first substrate further comprises:
   forming a second RDL metallization layer adjacent to the first RDL metallization layer, wherein forming the second RDL metallization layer comprises:
      forming a second photosensitive non-polymer dielectric material layer; and
      forming a plurality of second metal interconnects in the second photosensitive non-polymer dielectric material layer.

21. The method of any of clauses 17-19, wherein:
   forming the first photosensitive non-polymer dielectric material layer comprises forming a non-polymer material; and
   forming the first RDL metallization layer further comprises forming a first photosensitive polymer dielectric material layer adjacent to the first photosensitive non-polymer dielectric material layer;
   further comprising forming the plurality of first metal interconnects in the first photosensitive non-polymer dielectric material layer and the first photosensitive polymer dielectric material layer.

22. The method of clause 21, wherein forming the first substrate further comprises forming a second RDL metallization layer adjacent to the first RDL metallization layer,
   wherein forming the second RDL metallization layer comprises:
      forming a second photosensitive non-polymer dielectric material layer;
      forming a second photosensitive polymer dielectric material layer adjacent to the second photosensitive non-polymer dielectric material layer; and
      forming a plurality of second metal interconnects in the second photosensitive non-polymer dielectric material layer and the second photosensitive polymer dielectric material layer.

23. The method of any of clauses 17-22, wherein the first photosensitive non-polymer dielectric material layer has an elastic modulus between 63 and 77 GigaPascals (GPa).

24. The method of any of clauses 17-23, wherein the first photosensitive non-polymer dielectric material layer has a coefficient of thermal expansion (CTE) less than one (1) parts per million (ppm) per degree Celsius (C) (ppm/° C.).

25. The method of any of clauses 17-24, wherein the first photosensitive non-polymer dielectric material layer has a thermal stability up to 900 degrees Celsius (° C.).

26. The method of any of clauses 17-25, wherein the first photosensitive non-polymer dielectric material layer comprises a first photosensitive non-polymer dielectric material comprising a non-polymer material.

What is claimed is:

1. A package-on-package, comprising:
a first die package, comprising:
   a first substrate, comprising:
      a first re-distribution layer (RDL) metallization layer, comprising:
         a first photosensitive non-polymer dielectric material layer; and
         a plurality of first metal interconnects disposed in the first photosensitive non-polymer dielectric material layer; and
   a first die comprising a plurality of first die interconnects each coupled to a first metal interconnect of the plurality of first metal interconnects; and a second die package, comprising:
  a second substrate, comprising:
    a second RDL metallization layer, comprising:
      a second photosensitive non-polymer dielectric material layer; and
      a plurality of second metal interconnects disposed in the second photosensitive non-polymer dielectric material layer; and
    a second die comprising a plurality of second die interconnects each coupled to a second metal interconnect of the plurality of second metal interconnects;
  wherein:
    the first die package is coupled to the second die package; and
    at least one second metal interconnect of the plurality of second metal interconnects is coupled to at least one first metal interconnect of the plurality of first metal interconnects.

2. The package-on-package of claim 1, wherein at least one of the first photosensitive non-polymer dielectric material layer and the second photosensitive non-polymer dielectric material layer comprises a spin-on photosensitive non-polymer dielectric material.

3. The package-on-package of claim 1, wherein at least one of the first photosensitive non-polymer dielectric material layer and the second photosensitive non-polymer dielectric material layer comprises a first photosensitive non-polymer dielectric film.

4. The package-on-package of claim 1, wherein at least one of the first photosensitive non-polymer dielectric material layer and the second photosensitive non-polymer dielectric material layer comprises an inorganic material.

5. The package-on-package of claim 1, wherein at least one of the first photosensitive non-polymer dielectric material layer and the second photosensitive non-polymer dielectric material layer comprises a material comprised from the group consisting of a Silicon Oxide (SiOx) and a Silicon Nitride (SiN).

6. The package-on-package of claim 1, wherein at least one of the first photosensitive non-polymer dielectric material layer and the second photosensitive non-polymer dielectric material layer has an elastic modulus between 63 and 77 GigaPascals (GPa).

7. The package-on-package of claim 1, wherein at least one of the first photosensitive non-polymer dielectric material layer and the second photosensitive non-polymer dielectric material layer has a coefficient of thermal expansion (CTE) less than one (1) parts per million (ppm) per degree Celsius (C) (ppm/C°).

8. The package-on-package of claim 1, wherein at least one of the first photosensitive non-polymer dielectric material layer and the second photosensitive non-polymer dielectric material layer has a thermal stability up to 900 degrees Celsius (CO).

9. The package-on-package of claim 1, wherein:
  the first RDL metallization layer further comprises a first photosensitive polymer dielectric material layer adjacent to the first photosensitive non-polymer dielectric material layer; and
  the plurality of first metal interconnects disposed in the first photosensitive non-polymer dielectric material layer and the first photosensitive polymer dielectric material layer.

10. The package-on-package of claim 9, wherein:
  the first substrate further comprises a third RDL metallization layer adjacent to the first RDL metallization layer, the third RDL metallization layer comprising:
    a third photosensitive non-polymer dielectric material layer;
    a third photosensitive polymer dielectric material layer adjacent to the third photosensitive non-polymer dielectric material layer; and
    a plurality of third metal interconnects disposed in the third photosensitive non-polymer dielectric material layer and the third photosensitive polymer dielectric material layer.

11. The package-on-package of claim 10, wherein the first photosensitive polymer dielectric material layer is adjacent to the third photosensitive polymer dielectric material layer.

12. The package-on-package of claim 10, wherein the first photosensitive non-polymer dielectric material layer is adjacent to the first photosensitive polymer dielectric material layer.

13. The package-on-package of claim 1, wherein:
  the first RDL metallization layer extends in a first plane in a first direction;
  each of the plurality of first metal interconnects comprises:
    a first via extending in a second plane orthogonal to the first plane; and
    a first metal line coupled to the first via, the first metal line comprising a first metal line portion intersecting the second plane and a second metal line portion not intersecting the second plane.

14. The package-on-package of claim 1, wherein the first substrate further comprises a first surface and a second surface opposing the first surface; and
  the first RDL metallization layer disposed between the first surface and the second surface.

15. The package-on-package of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

16. A method of fabricating a package-on-package, comprising:
  forming a first die package, comprising:
    providing a first die comprising a plurality of first die interconnects;
    forming a first substrate, comprising:
      forming a first re-distribution layer (RDL) metallization layer, comprising:
        forming a first photosensitive non-polymer dielectric material layer; and
        forming a plurality of first metal interconnects in the first photosensitive non-polymer dielectric material layer; and coupling each of the plurality of first die interconnects of the first die to a first metal interconnect of the plurality of first metal interconnects;

forming a second die package, comprising:
  providing a second die comprising a plurality of second die interconnects;
  forming a second substrate, comprising:
    forming a second RDL metallization layer, comprising:
      forming a second photosensitive non-polymer dielectric material layer; and
      forming a plurality of second metal interconnects in the second photosensitive non-polymer dielectric material layer; and
    coupling each of the plurality of second die interconnects of the second die to a second metal interconnect of the plurality of second metal interconnects;
  coupling the first die package to the second die package; and
  coupling at least one second metal interconnect of the plurality of second metal interconnects to at least one first metal interconnect of the plurality of first metal interconnects.

17. The method of claim 16, wherein forming the first substrate further comprises spinning on the first photosensitive non-polymer dielectric material layer on a carrier.

18. The method of claim 16, wherein forming the plurality of first metal interconnects in the first photosensitive non-polymer dielectric material layer comprises:
  forming a plurality of first openings in the first photosensitive non-polymer dielectric material layer;
  disposing a metal material in the plurality of first openings to form a plurality of first vias in the plurality of first openings; and
  forming a plurality of metal lines adjacent to the first photosensitive non-polymer dielectric material layer each coupled to a first via of the plurality of first vias.

19. The method of claim 16, wherein forming the first substrate further comprises:
  forming a third RDL metallization layer adjacent to the first RDL metallization layer, wherein forming the third RDL metallization layer comprises:
    forming a third photosensitive non-polymer dielectric material layer; and
    forming a plurality of third metal interconnects in the second photosensitive non-polymer dielectric material layer.

20. The method of claim 16, wherein:
  forming the first photosensitive non-polymer dielectric material layer comprises forming a non-polymer material; and
  forming the first RDL metallization layer further comprises forming a first photosensitive polymer dielectric material layer adjacent to the first photosensitive non-polymer dielectric material layer;
  further comprising forming the plurality of first metal interconnects in the first photosensitive non-polymer dielectric material layer and the first photosensitive polymer dielectric material layer.

21. The method of claim 20, wherein forming the first substrate further comprises forming a third RDL metallization layer adjacent to the first RDL metallization layer,
  wherein forming the third RDL metallization layer comprises:
    forming a third photosensitive non-polymer dielectric material layer;
    forming a third photosensitive polymer dielectric material layer adjacent to the third photosensitive non-polymer dielectric material layer; and
    forming a plurality of third metal interconnects in the third photosensitive non-polymer dielectric material layer and the third photosensitive polymer dielectric material layer.

* * * * *